US012568774B2

(12) United States Patent
Badcock et al.

(10) Patent No.: US 12,568,774 B2
(45) Date of Patent: Mar. 3, 2026

(54) SUPERCONDUCTING SWITCHES

(71) Applicant: VICTORIA LINK LIMITED, Wellington (NZ)

(72) Inventors: Rodney Alan Badcock, Wellington (NZ); Christopher William Bumby, Wellington (NZ); Jianzhao Geng, Hubei (CN); James Hamilton Palmer Rice, Wellington (NZ)

(73) Assignee: VICTORIA LINK LIMITED, Wellington (NZ)

( * ) Notice: Subject to any disclaimer, the term of this patent is extended or adjusted under 35 U.S.C. 154(b) by 404 days.

(21) Appl. No.: 18/272,972

(22) PCT Filed: Jan. 26, 2022

(86) PCT No.: PCT/NZ2022/050008
§ 371 (c)(1),
(2) Date: Jul. 18, 2023

(87) PCT Pub. No.: WO2022/164329
PCT Pub. Date: Aug. 4, 2022

(65) Prior Publication Data
US 2024/0090349 A1      Mar. 14, 2024

(30) Foreign Application Priority Data

Jan. 26, 2021   (AU) ................................. 2021900162
Jan. 26, 2021   (AU) ................................. 2021900163
Oct. 26, 2021   (AU) ................................. 2021903413

(51) Int. Cl.
| | |
|---|---|
| *H10N 60/84* | (2023.01) |
| *H10N 60/35* | (2023.01) |
| *H10N 60/83* | (2023.01) |

(52) U.S. Cl.
CPC ............. *H10N 60/84* (2023.02); *H10N 60/35* (2023.02); *H10N 60/83* (2023.02)

(58) Field of Classification Search
CPC ......... H10N 60/84; H10N 60/83; H10N 60/35
See application file for complete search history.

(56) References Cited

U.S. PATENT DOCUMENTS

| | | | |
|---|---|---|---|
| 3,384,762 | A | 5/1968 | Mawardi |
| 4,122,512 | A | 10/1978 | Peterson et al. |

(Continued)

FOREIGN PATENT DOCUMENTS

| | | |
|---|---|---|
| IN | 320055 | 10/2011 |
| JP | 2003069093 A | 3/2003 |

(Continued)

OTHER PUBLICATIONS

Partial Supplementary European Search Report in EP Application No. 22746334.6-1211/4272267, mailed Dec. 19, 2024 (13 pages).

(Continued)

*Primary Examiner* — Kyung S Lee
(74) *Attorney, Agent, or Firm* — Leason Ellis LLP

(57) ABSTRACT

There is provided an electrical switch comprising a length of superconducting material. In some forms the electrical switch is configured to be controlled between a low-resistance state and a higher-resistance state by the selective application of one or more switching mechanisms. In the higher-resistance state, current flowing through the length of superconducting material may approach the critical current of the length of superconducting material, may be substantially equal to the critical current or may be greater than the critical current. In some forms, the length of superconducting material is a length of high temperature superconducting material. The switching mechanisms may comprise: heating the length of superconducting material; applying a magnetic (Continued)

field to the length of superconducting material; applying a time-varying magnetic field to create dynamic resistance and/or heat; and/or applying a time-varying magnetic field to a loop of superconducting material to create a screening current around the loop.

22 Claims, 21 Drawing Sheets

(56)                    References Cited

U.S. PATENT DOCUMENTS

| | | | |
|---|---|---|---|
| 4,348,630 | A | 9/1982 | Boenig et al. |
| 5,036,042 | A | 7/1991 | Hed |
| 5,107,240 | A | 4/1992 | Tashiro et al. |
| 5,241,447 | A * | 8/1993 | Barber .................. H03K 17/92 336/DIG. 1 |
| 5,805,036 | A | 9/1998 | Hodge et al. |
| 6,147,579 | A | 11/2000 | Einziger et al. |
| 8,384,504 | B2 | 2/2013 | Diederichs et al. |
| 10,269,478 | B2 * | 4/2019 | Geng ...................... H01F 6/06 |
| 12,439,833 | B2 * | 10/2025 | Badcock ................ H01F 6/008 |
| 2002/0017970 | A1 | 2/2002 | Kinder |
| 2007/0127171 | A1 * | 6/2007 | Lee ........................ H02H 9/023 361/19 |
| 2008/0204671 | A1 | 8/2008 | Jeitner |
| 2012/0010083 | A1 | 1/2012 | Vaucher |
| 2013/0096008 | A1 | 4/2013 | Bright et al. |
| 2016/0197471 | A1 * | 7/2016 | Klaus ................... H10N 60/30 361/19 |
| 2017/0069415 | A1 | 3/2017 | Faley et al. |
| 2018/0218818 | A1 | 8/2018 | Geng et al. |

FOREIGN PATENT DOCUMENTS

| | | |
|---|---|---|
| WO | 1997026668 | 7/1997 |
| WO | 03056381 A1 | 7/2003 |
| WO | 2021080443 | 4/2021 |

OTHER PUBLICATIONS

Extended European Search Report in EP Application No. 22746334.6-1211/4272267, mailed Apr. 4, 2025 (12 pages).

Jianzhao Geng, "A wireless rectifier for inductively energizing high direct-current high-temperature superconducting magnets", IEEE Transactions on Industrial Electronics, vol. 68, No. 4, Mar. 25, 2020, 3273-3281.

International Search Report and Written Opinion in corresponding International Patent Application No. PCT/NZ2021/050008, mailed Apr. 19, 2022 (11 pages).

Chao Li et al: "Design for a Persistent Current Switch Controlled by Alternating Current Magnetic Field", IEEE Transactions on Applied Superconductivity, vol. 28, No. 4, Jun. 2018, p. 1-5. Whole document, especially abstract, Introduction and Fig.1.

Maximising the current output from a self-switching kA-class rectifier flux pump, Jianzhao Geng et al, 2020 Supercond Sci Technol 33-045005.

An HTS flux pump by directly driving a superconductor into a flux flow region in the E-J curve, Jianzhao Geng and T A Coombs, May 6, 2016 Supercond Sci Technol 29-095004.

Dynamic resistance of YBCO-coated conductors in applied AC fields with DC transport currents and DC background fields, Duckworth et al, IEEE Transactions on Applied Superconductivity, vol. 21, No. 3, Jun. 2011.

Active Quenching Technique for YBCO Tapes: Quench Acceleration and Protection, X. Zhang et al, Journal of Superconductivity and Novel Magnetism (2018) 31:3465-3474, Mar. 19, 2018, pp. 3465-3474.

A Flux Pump for NMR Magnets, Haigun Lee et al., IEEE Transactions on Applied Superconductivity, 13, Jun. 2003.

A Circuit Analysis of a Flux Pump, Archie Campbell, Superconductor Science and Technology, 32, Oct. 7, 2019.

* cited by examiner

800

822

826

828

850

852

810

824

820

SUPERCONDUCTING SWITCHES

This patent application is a U.S. National Phase Application under 35 U.S.C. § 371 of International Patent Application No. PCT/NZ2022/050008, filed on Jan. 26, 2022, which claims priority from Australian patent application no. 2021903413, filed on Oct. 26, 2021, Australian patent application no. 2021900163, filed on Jan. 26, 2021, and Australian patent application no. 2021900162, filed on Jan. 26, 2021, all of which are incorporated by reference, as if expressly set forth in their respective entireties herein.

1. FIELD OF INVENTION

The present technology relates to superconducting electrical switches. More particularly, the present technology relates to electrical switches comprising components formed from superconducting materials, especially high-temperature superconducting materials.

2. BACKGROUND TO THE INVENTION

In superconducting circuits it is often difficult to introduce components which have similarly low, or zero resistance conductive paths. Introducing components which are not superconducting can result in a degradation of the circuit performance, making the overall circuit less efficient. Furthermore, when resistance is added to a high-current superconducting circuit, greater cooling is needed to counteract the heating of the resistive component.

A further issue with introducing resistive components into a superconducting circuit is that any DC currents flowing in said circuit will immediately decay if the current supply is removed. In contrast, in superconducting circuits, the current decays in accordance with the time constant (L/R) of the circuit. In other words, circuits which are superconducting have the advantage of being able to support the flow of DC currents long after the supply has been turned off. The current decay rate in these superconducting circuits is determined by any non-zero resistance associated with normal-conducting joints within the circuit.

There is accordingly a need to be able to provide components or arrangements which are able to work more efficiently in a superconducting circuit, and preferably without significantly degrading their performance.

One type of component used in these superconducting circuits are variable-resistance current switches. However, there are a number of known disadvantages of existing current switch devices. For example, thermally controlled switches are typically slow to respond and are unsuitable for use in high-speed switching applications. Current-controlled switches normally apply current pulses which exceed the critical current of the superconductor and as such these types of switch device are prone to degradation. Existing magnetic field-controlled switch devices are controlled by high strength magnetic fields, however when active, the resistance per unit length of these magnetic field-controlled switch devices is small, and the switching rates are generally limited by the large inductance of the applied field coil.

3. OBJECT OF THE INVENTION

It is an object of the technology to meet any one or more of the aforementioned needs by providing an electrical switch comprising at least one component formed of a superconducting material. Alternatively, it is an object of the technology to at least provide the public with a useful choice.

4. SUMMARY OF THE INVENTION

According to one aspect of the technology there is provided an electrical switch comprising a length of superconducting material. In some forms the electrical switch is configured to be controlled between a low-resistance state and a higher-resistance state by the selective application of one or more switching mechanisms. In the higher-resistance state, current flowing through the length of superconducting material may approach the critical current of the length of superconducting material, may be substantially equal to the critical current or may be greater than the critical current. In some forms, the length of superconducting material is a length of high temperature superconducting material.

In certain forms of the technology, the switching mechanisms may comprise any one or more of:

1. Heating the length of superconducting material to reduce a critical current of the length of superconducting material;
2. Applying a magnetic field to the length of superconducting material to reduce the critical current of the length of superconducting material;
3. Applying a time-varying magnetic field to the length of superconducting material to create dynamic resistance in the length of superconducting material and/or to heat the length of the superconducting material through dynamic resistance and/or magnetisation; and
4. Applying a time-varying magnetic field to a loop of superconducting material to generate a screening current around the loop.

In examples, the electrical switch may comprise a heating assembly and/or one or more magnetic field generators in order to effect any combination of the above switching mechanisms.

According to one aspect of the technology there is provided an electrical switch comprising a length of superconducting material configured to carry a transport current, wherein the length of superconducting material has a critical current and a critical temperature. The electrical switch may further comprise a magnetic field generator configured to apply a magnetic field to the length of superconducting material. The electrical switch may further comprise a heating assembly for heating the length of superconducting material. The magnetic field generator and the heating assembly may be configured to be selectively controlled independently or in combination to switch the electrical switch between a low-resistance state and a higher resistance state. In the low-resistance state, a magnitude of the magnetic field may be relatively low and a temperature of the length of superconducting material may be substantially less than the critical temperature such that the transport current is substantially less than the critical current. In the higher-resistance state the magnitude of the magnetic field may be relatively high to reduce the critical current and/or the heating assembly may heat the length of superconducting material to reduce the critical current, such that the transport current approaches the critical current, is substantially equal to the critical current or is greater than the critical current of the length of superconducting material.

In examples:

a) the magnetic field generator and the heating assembly may be configured to be selectively activated and de-activated independently or in combination to switch the electrical switch between the low-resistance state and the higher resistance state;

b) the heating assembly may be configured to remain activated and the electrical switch may be switched between the low-resistance state and the higher-resistance state by selective de-activation and activation of the magnetic field generator;

c) the magnetic field applied by the magnetic field generator may be a constant magnetic field;

d) the heating assembly may comprise a resistive heating element positioned in thermal contact with the length of superconducting material;

e) the superconducting material may be a high-temperature superconducting material;

f) the magnetic field generator may be a first magnetic field generator and the magnetic field may be a first magnetic field, and wherein the electrical switch may comprise a second magnetic field generator configured to apply a second, time-varying, magnetic field to the length of superconducting material. The second magnetic field generator may be configured to be selectively controlled to switch the electrical switch between the low-resistance state and the higher resistance state;

g) the superconducting material may be a tape having two opposed faces;

h) the second magnetic field generator may be configured to apply the second magnetic field in a direction substantially perpendicular to the two opposed faces;

i) the first magnetic field generator and the second magnetic field generator may be the same magnetic field generator, wherein the magnitude of the magnetic field applied by the same magnetic field generator varies in time with a DC bias.

j) the length of superconducting material may comprise a loop of superconducting material configured to carry the transport current between a first terminal and a second terminal. The loop may comprise a first branch and a second branch, the first and second branches being electrically connected in parallel between the first terminal and the second terminal. The loop may have an axis which is substantially normal to the plane of the loop; and k) the electrical switch may further comprise a third, time-varying, magnetic field generator configured to apply a third, time-varying, magnetic field through the loop with the direction of the third magnetic field through the loop being generally parallel to, or having a component which is generally parallel to, the axis of the loop. In the low-resistance state, the third magnetic field generator may not apply the third magnetic field through the loop and the transport current flows through the loop between the two terminals. In the higher-resistance state, the third magnetic field generator may apply the third magnetic field through the loop, inducing a screening current in the loop such that a total current in one or more of the first branch and the second branch approaches the critical current, is substantially equal to the critical current or is greater than the critical current of the superconducting material.

According to one aspect of the technology there is provided an electrical switch comprising a length of superconducting material configured to carry a transport current, wherein the length of superconducting material has a critical current and a critical temperature. The electrical switch may comprise a first magnetic field generator configured to apply a first, constant, magnetic field to the length of superconducting material. The electrical switch may further comprise a second magnetic field generator configured to apply a second, time-varying, magnetic field to the length of superconducting material. The first magnetic field generator and the second magnetic field generator may be configured to be selectively controlled independently or in combination to switch the electrical switch between a low-resistance state and a higher resistance state. In the low-resistance state, magnitudes of the first magnetic field and the second magnetic field may be relatively low and the transport current may be substantially less than the critical current. In the higher-resistance state the magnitude of the first magnetic field may be relatively high to reduce the critical current such that the transport current approaches the critical current, is substantially equal to the critical current or is greater than the critical current of the length of superconducting material, and/or the second magnetic field may create dynamic resistance in the length of superconducting material.

In examples:

a) the first magnetic field generator and the second magnetic field generator may be configured to be selectively activated and de-activated independently or in combination to switch the electrical switch between the low-resistance state and the higher resistance state;

b) the first magnetic field generator may be configured to remain activated and the electrical switch may be switched between the low-resistance state and the higher-resistance state by selective de-activation and activation of the second magnetic field generator;

c) the second magnetic field generator may be configured to remain activated and the electrical switch may be switched between the low-resistance state and the higher-resistance state by selective de-activation and activation of the first magnetic field generator;

d) the superconducting material may be a tape having two opposed faces. The second magnetic field generator may be configured to apply the second magnetic field in a direction substantially perpendicular to the two opposed faces;

e) the first magnetic field generator and the second magnetic field generator may be the same magnetic field generator, wherein the magnitude of the magnetic field applied by the same magnetic field generator varies in time with a DC bias;

f) the superconducting material may be a high-temperature superconducting material;

g) the electrical switch may further comprise a heating assembly for heating the length of superconducting material. In the higher-resistance state, the heating assembly may heat the length of superconducting material to reduce the critical current such that the transport current approaches the critical current, is substantially equal to the critical current or is greater than the critical current of the length of superconducting material;

h) the heating assembly may comprise a resistive heating element positioned in thermal contact with the length of superconducting material;

i) the length of superconducting material may comprise a loop of superconducting material configured to carry the transport current between a first terminal and a second terminal. The loop may comprise a first branch and a second branch, the first and second branches being electrically connected in parallel between the first terminal and the second terminal, and wherein the loop has an axis which is substantially normal to the plane of the loop; and

j) the electrical switch may further comprise a third, time-varying, magnetic field generator configured to apply a third, time-varying, magnetic field through the loop with the direction of the third magnetic field through the loop being generally parallel to, or having a component which is generally parallel to, the axis of the loop. In the low-resistance state, the third magnetic field generator may not apply the third magnetic field through the loop and the transport current flows through the loop between the two terminals. In the higher-resistance state, the third magnetic field generator may apply the third magnetic field through the loop, inducing a screening current in the loop such that a total current in one or more of the first branch and the second branch approaches the critical current, is substantially equal to the critical current or is greater than the critical current of the superconducting material.

According to one aspect of the technology there is provided an electrical switch comprising a loop of superconducting material configured to carry a transport current between a first terminal and a second terminal, wherein the loop of superconducting material has a critical current and a critical temperature. The loop may comprise a first branch and a second branch, the first and second branches being electrically connected in parallel between the first terminal and the second terminal, and wherein the loop has an axis which is substantially normal to the plane of the loop. The electrical switch may further comprise a time-varying magnetic field generator configured to apply a time-varying magnetic field through the loop with the direction of the magnetic field through the loop being generally parallel to, or having a component which is generally parallel to, the axis of the loop. The electrical switch may further comprise a heating assembly for heating the loop of superconducting material. The time-varying magnetic field generator and the heating assembly may be configured to be selectively controlled independently or in combination to switch the electrical switch between a low-resistance state and a higher-resistance state. In the low-resistance state the time-varying magnetic field generator may not apply the time-varying magnetic field through the loop and the transport current flows through the loop between the two terminals, the transport current being substantially less than the critical current, and a temperature of the loop may be substantially less than the critical temperature. In the higher-resistance state the time-varying magnetic field generator may apply the time-varying magnetic field through the loop, inducing a screening current in the loop, and/or the heating assembly may heat the loop to reduce the critical current, such that a total current in one or more of the first branch and the second branch approaches the critical current, is substantially equal to the critical current or is greater than the critical current of the superconducting material.

In examples:
a) the time-varying magnetic field generator and the heating assembly may be configured to be selectively activated and de-activated independently or in combination to switch the electrical switch between the low-resistance state and the higher resistance state;
b) the heating assembly may be configured to remain activated and the electrical switch may be switched between the low-resistance state and the higher-resistance state by selective de-activation and activation of the time-varying magnetic field generator;
c) the heating assembly may comprise a resistive heating element positioned in thermal contact with the loop of superconducting material;

6 d) the first branch may comprise one or more coils of superconducting material;
e) the second branch may comprise one or more coils of superconducting material;
f) the coils of the first branch may be wound around the same axis as the coils of the second branch;
g) the coils of the first branch may be wound in a first rotation direction and the coils of the second branch may be wound in a second rotation direction, wherein the first rotation direction is different to the second rotation direction;
h) the time-varying magnetic field generator may be magnetically coupled to the loop of superconducting material by a core;
i) the superconducting material may be a high-temperature superconducting material; and
j) the electrical switch may further comprise a second magnetic field generator configured to apply a second magnetic field to the loop of superconducting material. In the low-resistance state, a magnitude of the second magnetic field may be relatively low. In the high-resistance state, the magnitude of the second magnetic field may be relatively high to reduce the critical current.

According to one aspect of the technology there is provided an electrical switch comprising a loop of superconducting material configured to carry a transport current between a first terminal and a second terminal, wherein the loop of superconducting material has a critical current and a critical temperature. The loop may comprise a first branch and a second branch, the first and second branches being electrically connected in parallel between the first terminal and the second terminal. The loop may have an axis which is substantially normal to the plane of the loop. The electrical switch may further comprise a first magnetic field generator configured to apply a time-varying magnetic field through the loop with the direction of the magnetic field through the loop being generally parallel to, or having a component which is generally parallel to, the axis of the loop. The electrical switch may further comprise a second magnetic field generator configured to apply a second magnetic field to the length of superconducting material. The first magnetic field generator and the second magnetic field generator may be configured to be selectively controlled independently or in combination to switch the electrical switch between a low-resistance state and a higher-resistance state. In the low-resistance state, the first magnetic field generator may not apply the time-varying magnetic field through the loop and the transport current flows through the loop between the two terminals and a magnitude of the second magnetic field may be relatively low such that the transport current is substantially less than the critical current. In the higher-resistance state the first magnetic field generator may apply the time-varying magnetic field through the loop, inducing a screening current in the loop, and/or the magnitude of the second magnetic field may be relatively high to reduce the critical current, such that a total current in one or more of the first branch and the second branch approaches the critical current, is substantially equal to the critical current or is greater than the critical current of the superconducting material.

In examples:
a) the first magnetic field generator and the second magnetic field generator may be configured to be selectively activated and de-activated independently or in combination to switch the electrical switch between the low-resistance state and the higher resistance state;

b) the first magnetic field generator may be configured to remain activated and the electrical switch may be switched between the low-resistance state and the higher-resistance state by selective de-activation and activation of the second magnetic field generator;

c) the second magnetic field generator may be configured to remain activated and the electrical switch may be switched between the low-resistance state and the higher-resistance state by selective de-activation and activation of the first magnetic field generator;

d) the first branch may comprise one or more coils of superconducting material;

e) the second branch may comprise one or more coils of superconducting material;

f) the coils of the first branch may be wound around the same axis as the coils of the second branch;

g) the coils of the first branch may be wound in a first rotation direction and the coils of the second branch may be wound in a second rotation direction, wherein the first rotation direction is different to the second rotation direction;

h) the first magnetic field generator may be magnetically coupled to the loop of superconducting material by a core;

i) the second magnetic field applied by the second magnetic field generator may be a constant magnetic field;

j) the superconducting material may be a high-temperature superconducting material; and k) the electrical switch may further comprise a heating assembly for heating the loop of superconducting material. In the low-resistance state, a temperature of the loop may be substantially less than the critical temperature. In the higher-resistance state, the heating assembly may heat the loop to reduce the critical current.

In certain forms of the technology, the electrical switch of any one or more aspects of the technology may comprise superconducting material arranged in a bifilar arrangement. For example, the electrical switch may comprise first and second strands of superconducting material, each of the first and second strands of superconducting material being configured to carry a transport current and having a critical current. The electrical switch may further comprise a magnetic field generator configured and arranged to apply a magnetic field to the first and second strands of superconducting material. The magnetic field generator may comprise a high permeability magnetic core. The magnetic field generator may be configured to be selectively controlled to switch the electrical switch between a low-resistance state when a magnitude of the magnetic field is relatively low and a higher-resistance state when a magnitude of the magnetic field is relatively high. In the low-resistance state the transport current may be substantially less than the critical current. In the higher-resistance state the transport current may approach the critical current, be substantially equal to the critical current or be greater than the critical current. The first and second strands of superconducting material may be spatially arranged substantially parallel to each other within a region of the magnetic field and are electrically connected so that the transport current flows in opposite directions through the first and second strands of superconducting material within the region of the magnetic field.

In examples:

a) The high permeability magnetic core may comprise a first end and a second end separated by a gap, the first and second strands of superconducting material being positioned in the gap;

b) The first and second strands of superconducting material may be in the form of tapes each having two opposed faces;

c) The tapes may be arranged so that the opposed faces of the first strand of superconducting material are parallel with the opposed faces of the second strand of superconducting material;

d) The tapes may be oriented such that the magnetic field applied to the first and second strands of superconducting material is substantially perpendicular to each of the two opposed faces;

e) The electrical switch may comprise a length of superconducting material comprising the first and second strands of superconducting material; or the first and second strands of superconducting material may be electrically connected by connecting a face of the first strand to a face of the second strand; and f) The superconducting material is high temperature superconducting (HTS) material.

According to another form of the technology, the electrical switch of any one or more aspects of the technology may comprise a length of superconducting material configured to carry a transport current and having a critical current. The electrical switch may further comprise a magnetic field generator configured and arranged to apply a magnetic field to the length of superconducting material. The magnetic field generator may comprise a high permeability magnetic core. The magnetic field generator may be configured to be selectively controlled to switch the electrical switch between a low-resistance state when a magnitude of the magnetic field is relatively low and a higher-resistance state when a magnitude of the magnetic field is relatively high. In the low-resistance state the transport current may be substantially less than the critical current. In the higher-resistance state the transport current may approach the critical current, be substantially equal to the critical current or be greater than the critical current. The length of superconducting material may be arranged to substantially cancel a self-magnetic field generated by the transport current flowing through the length of superconducting material when in proximity to the high permeability magnetic core.

Further aspects of the technology, which should be considered in all its novel aspects, will become apparent to those skilled in the art upon reading of the following description which provides at least one example of a practical application of the technology.

5. BRIEF DESCRIPTION OF THE DRAWINGS

One or more embodiments of the technology will be described below by way of example only, and without intending to be limiting, with reference to the following drawings, in which.

6. DETAILED DESCRIPTION OF EXAMPLES OF THE TECHNOLOGY

6.1. Discussion on Superconductors

To aid in the understanding of the present technology the reader should be familiar with superconducting terminology including the critical temperature for a superconductor and the critical current for a superconductor. Nevertheless, for the benefit of the reader we briefly discuss these concepts below.

The critical temperature for a superconductor is conventionally defined as the temperature, below which the resistivity of the superconductor drops to zero or near zero. In other words, a superconductor is said to be in its superconducting state when the temperature of the superconductor is below the critical temperature and in a non-superconducting state when the temperature is above the critical temperature. Many superconductors have a critical temperature which is near absolute zero; for example, mercury is known to have a critical temperature of 4.1K. It is however also known that some materials can have critical temperatures which are much higher such as 30K to 125K; for example, magnesium diboride has a critical temperature of approximately 39K, while yttrium barium copper oxide (YBCO) has a critical temperature of approximately 92K. These superconductors are often generally referred to as high-temperature superconductors (HTS).

The critical current for a high-temperature superconductor wire or tape is conventionally defined as the current flowing in a superconductor wire/tape which results in an electric field drop along the wire of 100 μV/m (=1 μV/cm). It should be appreciated that the critical current is a function of both the superconducting material used, and the physical arrangement of the superconducting material. For example, a wider tape/wire may have a higher critical current than a thinner tape/wire constructed of the same material. Nevertheless, it should be understood that, throughout the specification, reference to the critical current of the superconductor/superconducting material is made to simplify the discussion.

In a superconductor/superconducting material, if the current I is approximately equal to the critical current $I_c$, the resistance of the superconductor is non-zero, but small. However, if I is much larger than the critical current $I_c$, the resistance of the superconductor becomes sufficiently large to cause heat dissipation which can heat the superconductor to a temperature above its critical temperature, which in turn causes it to no longer be superconducting. This condition is sometimes referred to as a "quench" and can be damaging to the superconductor itself.

Figure 1:
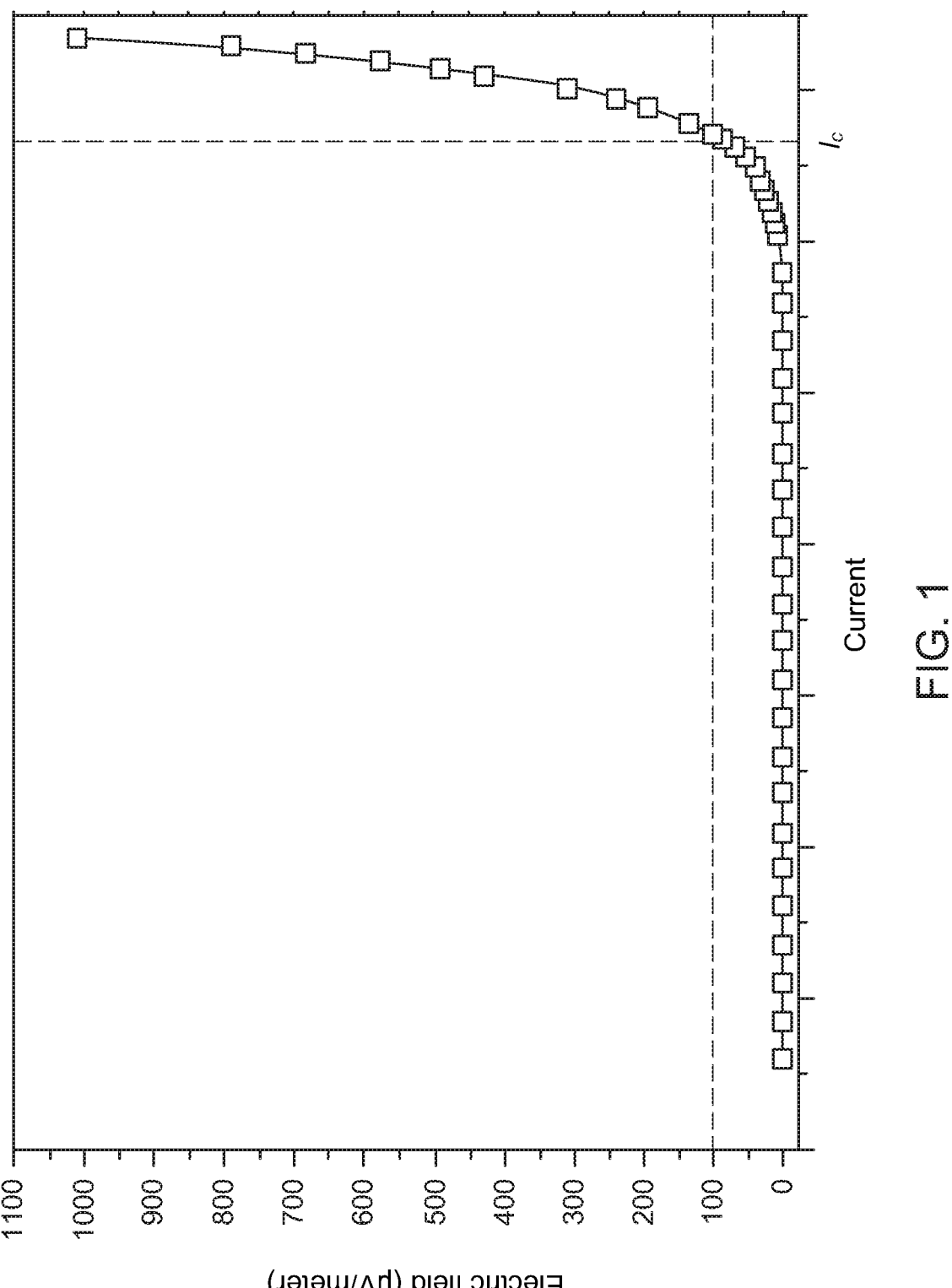
FIG. 1 shows an exemplary electric-field versus current graph for a high-temperature superconductor.

FIG. 1 shows an exemplary plot depicting the internal electric-field versus current curve for a high-temperature superconductor. It should be appreciated that the electric-field shown in this plot is related to resistance via the following equation:

$$E = \frac{IR}{L}$$

Where:
E is the electric field;
I is the current through the superconductor;
R is the resistance of the wire; and
L is the length of the wire.

Accordingly, the plot of FIG. 1 is related to the resistance per-unit length for the superconductor and, because the curve depicted is non-linear, the resulting resistance for the superconductor is non-linear with current.

In this figure it can be seen that the electric field strength in the superconductor is substantially zero below the critical current $I_c$ for the superconductor. As the current in the superconductor approaches the critical current, the electric-field in the superconductor starts to increase. At the critical current, the electric-field in the superconductor is 100 μV/m. Further increasing the current in the superconductor above the critical current results in rapid increases in the electric-field strength in the conductor.

Throughout the present specification reference will be made to the relative resistances of a superconducting material and components comprising a superconducting material. More particularly, the specification refers to a superconducting material being in a low-resistance or higher-resistance state. It will be appreciated that, when in a superconducting state, superconducting materials can have a resistance which is zero or substantially zero, and as such these resistances are often expressed in terms of the electric field present across the superconducting material for a given current. Nevertheless, throughout the present specification, reference is made to relative resistances, for example low-resistance and higher-resistance states of the superconducting material, in order to simplify the foregoing discussion.

The term 'low-resistance state' may refer to when the superconducting material has a resistance that is close to or substantially zero in the superconducting state, or when the material has a low resistance in a partially superconducting state. The term 'higher-resistance' state refers to a state in which the superconducting material has a resistance that is substantially greater than the resistance in the low resistance state, for example a substantially non-zero resistance or a resistance that is close to zero but substantially greater than the resistance in the low-resistance state. For the avoidance of doubt, a higher-resistance state as referred to in this specification may, unless the context clearly indicates otherwise, include a superconducting state.

Similarly, where in this specification, reference is made to a superconductor being in a higher-resistance state as a result of a current carried by the superconductor exceeding the critical current, it should be understood that, unless the context clearly indicates otherwise, the higher-resistance state may also be achieved if the current carried by the superconductor approaches or is substantially equal to the critical current.

In describing the technology in this specification, material and components comprising the material are referred to as "superconducting". This term is used as a term commonly used in the art for such materials and should not be taken to mean that the relevant material is always in a superconducting state. Under certain conditions the material and components comprising the material may not be in a superconducting state. That is, the material may be described as being superconductive but not superconducting.

6.2. Superconducting Materials

Certain forms of the present technology may comprise a variety of types of superconducting material. For example, forms of the technology may comprise high-temperature superconducting (HTS) materials. Exemplary HTS materials suitable for use in the forms of technology described include copper-oxide superconductors, for example a rare-earth barium copper oxide (ReBCO) such as yttrium barium copper oxide or gadolinium barium copper oxide, and iron-based superconductors. Other types of superconductors may be used in other forms of the technology.

In certain forms, the superconducting material may be provided in the form of a tape. A tape may be described as being a length of material having a width greater, including significantly greater, than its depth and having two opposed faces.

6.3. Switching Mechanisms

Forms of the technology make use of different mechanisms that may be used to effect switching of an electrical switch formed from (including comprising) a superconducting material. The individual mechanisms will now be described, and then examples of how certain forms of the technology utilise the mechanisms in combination will be described.

6.3.1. Effect of Magnetic Field on Critical Current of Superconductors

The critical current in a superconductor is dependent on the external magnetic field applied to the superconductor.

Figure 1A:
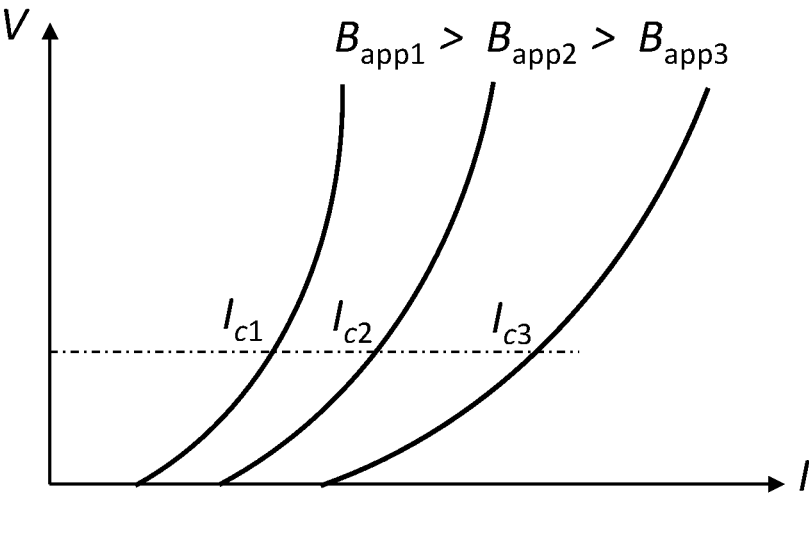
FIG. 1A is an illustration of graphs of electric field against current for a superconducting material when three external magnetic fields of different magnitude are applied.

More particularly, the critical current decreases as a higher external magnetic field is applied to the superconductor, up to the value of the critical field, above which the superconductor is no longer in the superconducting (low resistance) state. This relationship is shown in FIG. 1A, which is an illustration of graphs of electric field against current for a superconducting material when three external magnetic fields of different magnitude are applied. The highest magnitude of external magnetic field, $B_{app2}$, results in the lowest critical current, $I_{c2}$.

Forms of the technology relate to electrical switches that utilise the principle that the critical current of a superconducting material decreases as a higher external magnetic field is applied to the material. By selectively applying a magnetic field to a superconducting material, for example a magnetic field that is substantially constant over a period of time (i.e. a DC field), the critical current can be raised or lowered relative to the transport current in order to switch the superconducting material between a low-resistance state and a higher-resistance state. In particular, while a high-temperature superconductor (HTS) may need to have an impracticably high field applied to it for the field itself to switch the superconductor into the higher-resistance state, fields of a practical magnitude can be applied to reduce the critical current sufficiently for another mechanism to effect switching.

6.3.2. Effect of Time-Varying Magnetic Field on Superconductors—Dynamic Resistance & Heating Certain forms of the technology utilise the phenomenon of dynamic resistance. This occurs when a superconductor is exposed to a time-varying magnetic field while carrying a DC transport current. This creates a DC electrical resistance in the superconductor, which may be sufficiently large that the superconductor switches into a higher-resistance state.

The DC electrical resistance in the superconductor caused by this phenomenon may additionally lead to energy loss through heating of the superconductor. When a time-varying magnetic field is applied to a superconductor there may also be heat loss due to magnetisation. The loss due to dynamic resistance may occur in the region of the transport current, for example a central region of the length of superconducting material, while the magnetisation loss may occur in the edge regions of the superconducting material. The amount of heating may depend on the frequency and amplitude of the applied time-varying magnetic field.

The time-varying magnetic field that causes the dynamic resistance phenomenon may be an alternating magnetic field, for example a magnetic field varying sinusoidally.

In the case of a superconducting material having a length significantly larger than its width or depth (e.g. a wire or tape), dynamic resistance is mainly caused by the component of the time-varying magnetic field that is applied to the superconducting material that is perpendicular to the direction along the length of the material.

6.3.3. Heating of Superconductors

As explained above, the critical current of a superconducting material is a function of both the type of superconducting material used, and the physical arrangement of the superconducting material. The critical current is also dependent on the temperature of the superconducting material. As the temperature of the superconducting material increases, the critical current decreases. This relationship continues up to the critical temperature, above which the superconducting material is no longer superconducting.

Forms of the technology relate to electrical switches that utilise the principle that the critical current of a superconducting material decreases as the temperature of the superconducting material increase. By selectively heating a superconducting material, the critical current can be raised or lowered relative to the transport current in order to switch the superconducting material between a low-resistance state and a higher-resistance state.

Different forms of the technology may use different mechanisms to heat the superconducting material in the electrical switch and forms of the technology may not be limited to the mechanism used to achieve the heating. Nevertheless, two examples of mechanisms for heating a superconducting material are provided in exemplary forms of the technology. These two mechanisms are now briefly explained.

Firstly, a heating element may be positioned in thermal contact with the superconducting material. The heating element may be, for example, a resistive heating element that converts electrical energy into heat energy through the process of Joule heating as an electrical current flowing through a conductor encounters electrical resistance. The heating element may be positioned in physical contact with the superconducting material to primarily heat the material through conduction, or spaced from the superconducting material to primarily heat the material through convection and/or radiation.

Secondly, forms of the technology may utilise the heating effect caused by applying a time-varying magnetic field (for example, an alternating magnetic field, which may be referred to as an AC field) to a length of superconducting material resulting from the phenomenon of dynamic resistance and magnetisation, as explained above.

6.3.4. Screening Current

Applying a time-varying magnetic field to a loop of superconducting material causes a screening current to flow around the loop which, in combination with a transport current carried by the loop, may exceed the critical current of the superconducting material. Consequently, by selectively applying a time-varying magnetic field to a loop of superconducting material, the loop may be transitioned between a low-resistance state and a higher-resistance state.

Forms of electrical switches utilising this switching mechanism will now be described. It should be appreciated that, where features are described in the following in relation to exemplary forms of electrical switch utilising this mechanism alone, those features may also be used in any of the forms of electrical switches utilising combinations of switching mechanisms later in this specification. Further details of this switching mechanism are provided in PCT Application No. PCT/NZ2020/050132, the contents of which are herein incorporated by reference.

Figure 2A:
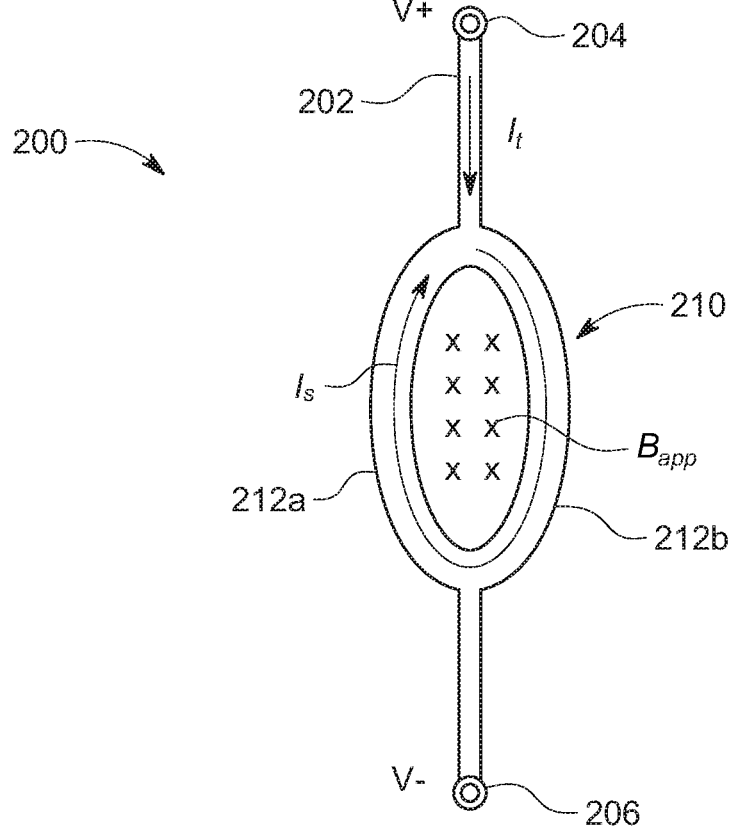
FIG. 2A illustrates an electrical switch according to one form of the present technology.

FIG. 2A is a schematic view of a switch 200 operating based on this switching mechanism according to the present technology. The switch 200 includes a superconducting material 202 which is connected between a first terminal 204 and a second terminal 206.

In use a transport current $I_t$ is selectively supplied to flow between the first terminal 204 and second terminal 206. In other words, the transport current $I_t$ may be turned off and on as required.

It should be appreciated that, in FIG. 2A, the first terminal 204 is illustrated as a positive terminal, and the second terminal 206 as a negative terminal for the sake of simplifying the foregoing discussion. Similarly, the transport current $I_t$ is shown as flowing from the first (positive) terminal 204 to the second (negative) terminal 206 as would be expected for conventionally defined direct current (DC) voltages. However, the use of DC voltages should not be seen as limiting on the technology as should become apparent from the foregoing discussion. It should be further appreciated that, where DC currents are used, the superconducting material experiences a negligible loss due to the low, zero or near-zero resistance of the superconducting material 202. Where AC currents are used the losses may generally be higher due to parasitic effects, although the total losses are significantly smaller than equivalent non-superconducting material.

The superconducting material 202 between the two terminals 204, 206 is formed in a loop 210 which comprises two electrically parallel superconducting branches 212a, 212b.

These superconducting branches 212a, 212b may be formed by joining two or more superconducting materials together using methods known to those skilled in the art, including methods which provide a non-zero joint resistance. Alternatively, the branches 212a, 212b may be formed using any method which provides a substantially zero resistance joint, such as by splitting a superconducting tape into two parallel branches.

In use a transport current is applied between the first terminal 204 and second terminal 206, using an electrical circuit (not shown) connected between the first 204 and second 206 terminals. This electrical circuit may include a power source, such as voltage or current source, a transformer or any other suitable electronic circuit as should be known to those skilled in the art. A time-varying magnetic field $B_{app}(t)$ is then selectively applied to, or within, the loop 210 in a direction which is normal to (or has a component which is normal to) the plane of the loop 210, i.e. parallel to an axis of the loop 210 where the axis is normal to the plane of the loop 210. In FIG. 2A, the time-varying magnetic field is applied to the loop 210 such that the magnetic field passes through the loop 210. It may be advantageous to provide the time-varying magnetic field in a direction which is substantially or at least partially normal to the plane of the loop so as to reduce losses which would otherwise be incurred due to the magnetic field penetrating or attempting to penetrate the superconductive material 202.

This time-varying magnetic field $B_{app}(t)$ causes a screening current ($I_s$) to flow around between the branches 212a, 212b of the loop 210 in order to oppose the flux change in the loop 210. This screening current Is adds to the transport current flowing around the loop 210 and as a result the total current flowing increases. This increase in current may result in a marginal increase in the resistance of the superconducting material (for example when the current is less than the critical current $I_c$ as shown in FIG. 1), or a substantial increase in the resistance of the superconducting material (for example when the current $I_c$ is near to, greater than, or equal to the critical current for the superconductor as shown in FIG. 1).

Figure 2B:
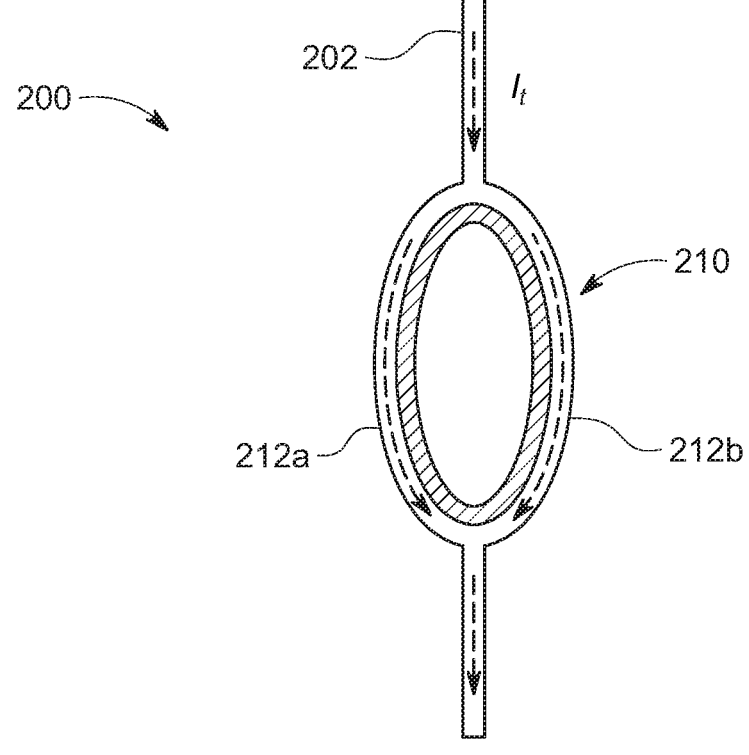
FIG. 2B illustrates the switch of FIG. 2A in a low-resistance state.
Figure 2C:
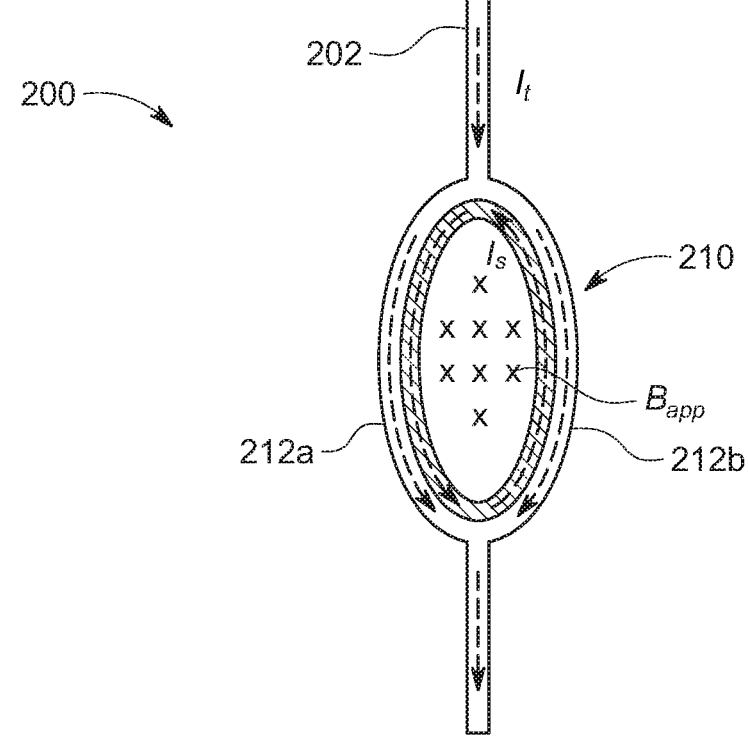
FIG. 2C illustrates the switch of FIG. 2A in a higher-resistance state.

Referring now to FIG. 2B which illustrates how the switch 200 of FIG. 2A behaves in the absence of a time-varying magnetic or in the presence of a non-time-varying magnetic field or weak time-varying magnetic field. It can be seen in FIG. 2B that the current flowing through the loop 210 is substantially equal to the transport current $I_t$. As the time-varying magnetic field is applied, or the magnitude of the magnetic field is increased or decreased, a screening current $I_s$ flows around the loop 210 as shown in FIG. 2C. If the sum of the transport current $I_t$ and screening current Is in any one of the branches 212a, 212b approaches or exceeds the critical current of the superconductor, the effective resistance of the branches 212a, 212b increases. As a result, the time-varying magnetic field can be applied to transition the switch between a low-resistance state and a higher-resistance state.

The low-resistance state of the switch 200 can be considered equivalent to the closed state of a switch 200 while the higher-resistance state is similar to an open state of a switch 200. It should be appreciated however that the higher-resistance state is not an electrical open-circuit as would be common for a mechanical switch but rather represents a higher-resistance conductive state for which the loop remains in the superconducting state, unless subsequent heating above Tc also occurs.

In some embodiments, the low-resistance state may be a superconducting state wherein the resistance of the branches 212a, 212b of the loop 210 are close to or substantially zero. That is to say that in a preferred embodiment, the low-resistance state of the switch has at least a portion of the loop 210 in a superconducting state. However, this should not be seen as limiting on the technology and in alternative embodiments the low resistance state may be a partially superconducting state. For example where one or more low resistance joints are formed between superconducting elements of the loop, by normal conducting metal soldered joints.

Similarly, the high-resistance state may be a superconducting state wherein the resistance of the branches 212a, 212b of the loop 210 are close to zero, but greater than the resistance in the low-resistance state. In one application for the present technology, the resistance of the branches 212a, 212b of the loop 210 in the high-resistance state may be substantially non-zero. For example, the loop 210 may be in a non-superconducting state or in a partially superconducting state.

It should therefore be appreciated that the present technology provides a switch which is able to transition between a low-resistance state and a high-resistance state when exposed to a time-varying magnetic field or when the amplitude of a time-varying magnetic field is varied. This advantageously may allow for construction of a faster switching, non-contact switch which may be more reliable than traditional current switches. Other potential advantages include the ability to create switching elements which are:

More compact than traditional switches, as will become apparent from the foregoing discussion;
  Faster switching than thermal switches, particularly in applications where the higher-resistance state of the switch is a superconducting state;
  Able to achieve higher off resistances than existing AC-field controlled switches;
  More efficient than traditional switches as there is reduced dissipation in the superconductor due to the exclusion of the magnetic field from the superconductor;
  More reliable than existing switches as the switch is non-contact and has lower dissipation; and
  Lower inductance which allows for lower power driving sources for the magnetic field generator.

Figure 3:
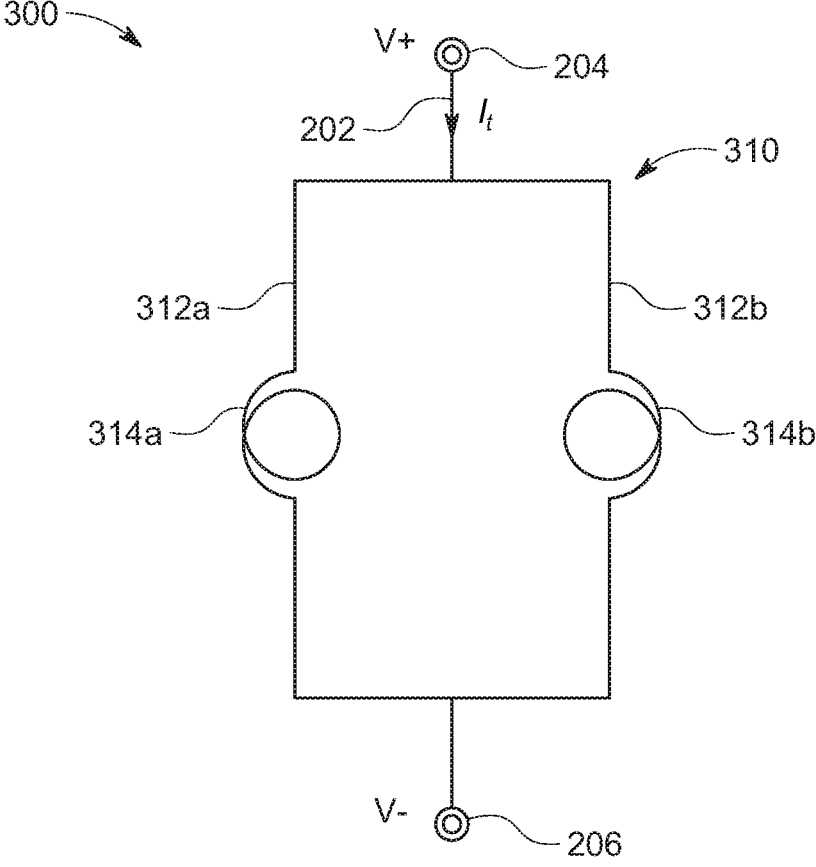
FIG. 3 illustrates an electrical switch according to another form of the present technology.

A further embodiment of a switch 300 according to the present technology is illustrated in FIG. 3. Like the previously described embodiment, the superconducting material 202 has been arranged in a loop 310 that includes two electrically parallel branches 312a, 312b. However, in this embodiment, each branch 312a, 312b includes a coil 314a, 314b of superconducting material and each coil comprises one or more turns.

It should be understood with reference to the figures and foregoing description that the loop of the present technology comprises two or more electrically parallel conductive paths. In contrast the coils of the present technology each have a singular conductive path consisting of one or more turns.

In use, a time-varying magnetic field $B_{app}$ is selectively applied through the loop 310 across both coils 314a, 314b in a direction which is normal to (or has a component which is normal to) the plane of the loop 310 and/or coils 314a, 314b. This causes a screening current I to flow around the closed loop 310 formed by the two parallel-connected branches 312a, 312b. This screening current can be used to selectively transition the switch 300 between a low-resistance and a higher-resistance state, as per the previous embodiments.

It may be desirable for the first branch 312a to include one or more coils 314a which are wound in a clockwise direction, while the second branch 312b includes one or more coils 314b which are wound in an anticlockwise direction or vice versa. This arrangement can be useful to ensure that the screening current in the first coil 314a is induced in the same direction as the screening current in the second coil 314b, thereby encouraging the screening current to flow around the loop 310. Furthermore, the use of coils 314a, 314b may advantageously make it easier to practically equalise the inductance of each branch 312a, 312b. For example, by using coils 314a, 314b having one or more turns, the geometric differences between each branch 312a, 312b, become a smaller fraction of the number of current-turns in each branch.

A further potential advantage of this arrangement is that it may allow for higher switching resistances than the previous embodiment due to the longer switching lengths in each branch.

Figure 4:
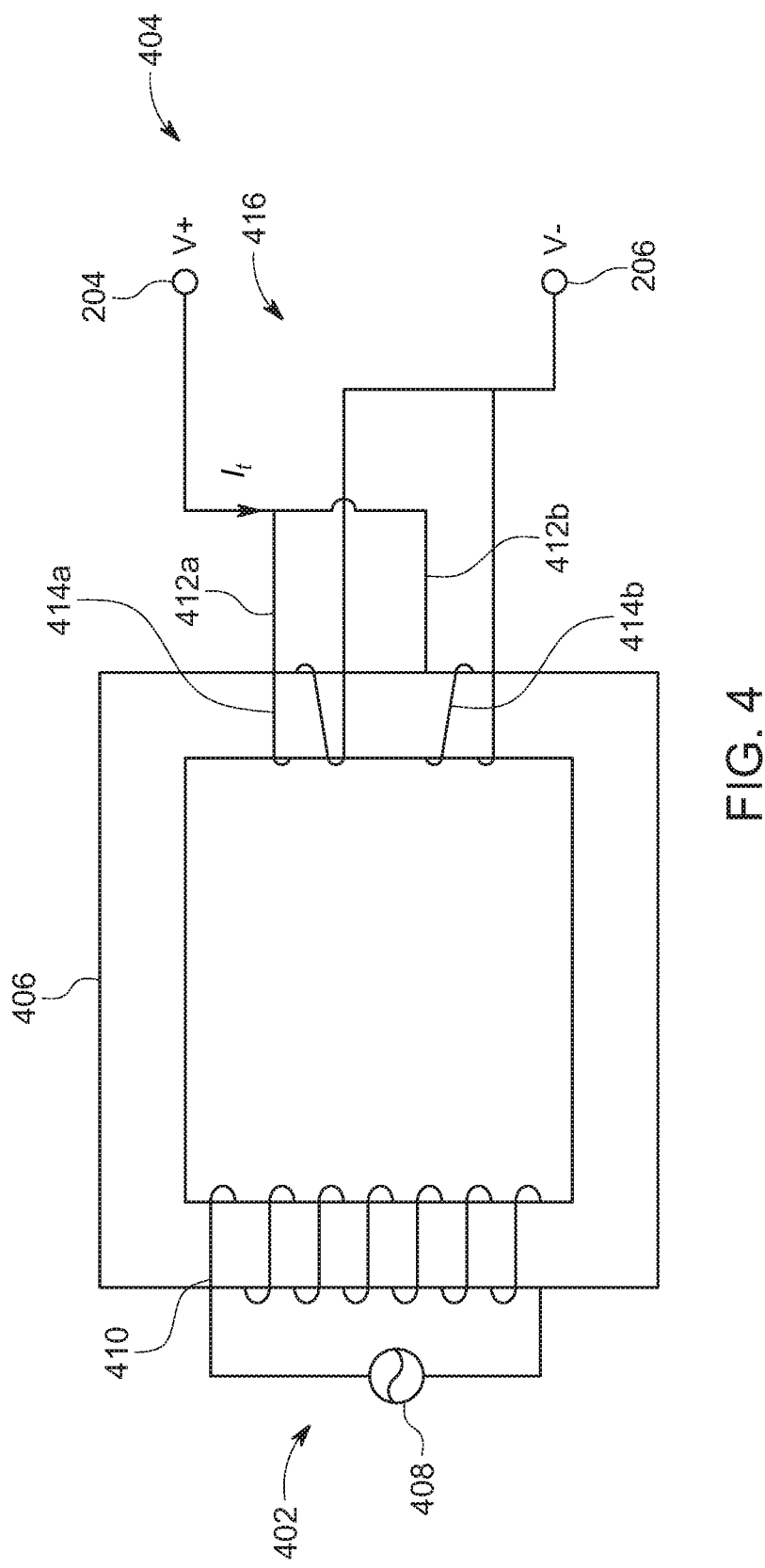
FIG. 4 shows a method of coupling a magnetic field generator to a switch according to one form of the present technology.

FIG. 4 is a schematic illustration showing one practical application for the switch 300 of FIG. 3. In this embodiment the coupling between the varying magnetic field generator 402 and the switch 404 may be improved by directing the magnetic flux through a core 406. In this way the arrangement of FIG. 4 resembles that of a transformer as should be well known to those skilled in the art.

The core 406 is preferably a high-permeability magnetic core such as an iron core, however this should not be seen as limiting on the technology as will become apparent from the foregoing discussion.

For sake of simplicity the magnetic field generator 402 is illustrated as an AC source 408 which is magnetically coupled to the core via a coil 410 that includes one or more turns. This however should not be seen as limiting on the technology and alternative methods of generating a varying magnetic field may be used for example by switching a DC current source.

To simplify the foregoing discussion, and to distinguish the coil 410 of the magnetic field generator from the coils 414a, 414b of the switch 402 reference herein will be made to the coil 410 of the magnetic field generator as a magnetic field generator coil 410, or simply generator coil.

It should also be appreciated that the magnetic field generator coil 410 may be constructed of any suitable conductive material including superconducting materials such as YBCO or non-superconducting materials such as copper and aluminium. In a preferred embodiment the generator coil 410 is constructed of copper. This may advantageously provide a lower-cost switch than similar switches that use superconducting generator coils 410.

To continue the transformer analogy, the generator coil 410 could be considered the primary side of the transformer, while the coils 414a, 414b of the switch could be considered the secondary side of the transformer.

Unlike a traditional transformer however the superconducting coils 414a, 414b of the switch 404 are wound around the core 406 in counter-rotating directions, and electrically connected in parallel with one another. As a result, the secondary winding coils are shorted and the net flux enclosed by coils 414a and 414b is approximately zero if coils 414a and 414b each have the same number of turns. The purpose of the core 406 is to couple the applied magnetic field to the pair of coils 414a and 414b that form the loop 416. This results in a screening current being generated in the loop 416 to oppose the flux changes from the magnetic field generator 402.

In use, the magnetic field generator 402 may be selectively enabled, or otherwise varied in amplitude as required to transition the switch 404 between the low-resistance and higher-resistance states.

In the low-resistance state, where the magnetic field generator 402 is not generating a varying magnetic field in the core 406, or otherwise is generating a weak magnetic field in the core 406, the transport current $I_c$ tends to be shared evenly between the two parallel branches 412a, 412b. In this state, these branches 412a, 412b have zero, or close to zero resistance, and furthermore, as the coils 414a, 414b are wound in counter-rotating directions there is little inductance present across the terminals 204 and 206. Furthermore, as the coils 414a, 414b are wound in counter-rotating directions and connected in parallel there is also substantially zero or otherwise very minimal flux induced into the core 406 from the coils 414a, 414b.

When the magnetic field generator 402 is activated, or the magnitude of the applied magnetic field is increased or decreased, a screening current $I_s$ is formed in the loop 416 of superconducting wire as described above. If the sum of the transport current $I_c$ and the screening current $I_s$ in one or both of the branches 414a, 414b is close to, equal to, or exceeds the critical current of the superconducting material, there will be a non-zero resistance in the branch(es). Accordingly, the magnetic field generator 402 may be activated, or alternatively the amplitude of the magnetic field generator varied, to switch the switch 404 between a low-resistance and a higher-resistance state.

Figure 5:
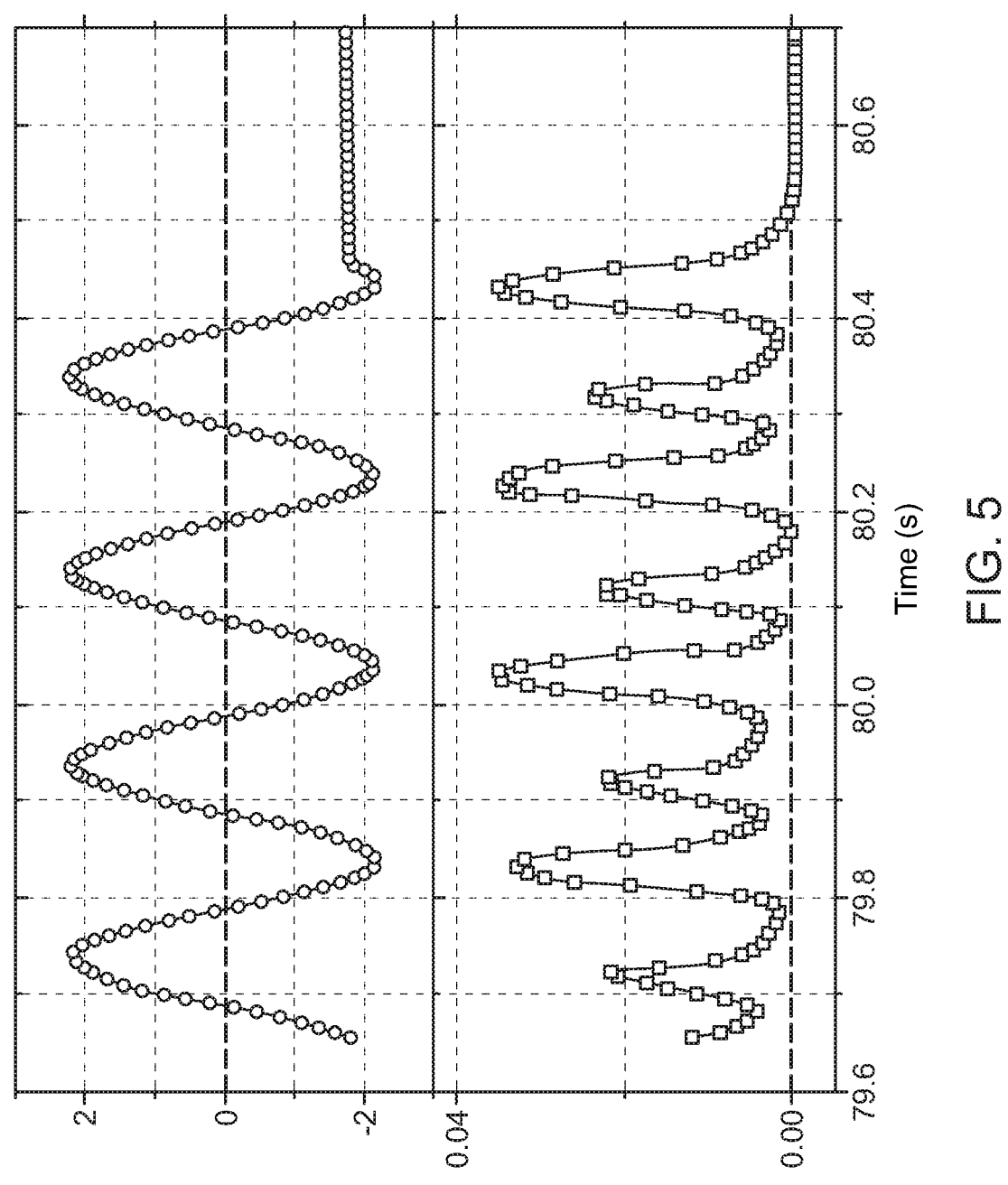
FIG. 5 shows a graph which compares the voltage measured across the terminals of a superconducting switch according to one form of the technology in the presence of and absence of a varying magnetic field.

FIG. 5 shows a measured example of the voltage across the terminals 204, 206 of a switch according to one form of the present technology. In this figure, the voltage across the switch is the voltage measured between the terminals 204, 206 of the switch. The magnetic field generator current reflects the amplitude of the current applied to the generator coil 410 by the magnetic field generator 402.

For sake of completeness, it is noted that a DC current of approximately 80 Amps was applied across the terminals 204, 206 using a current source. The superconducting coils 414a, 414b each consisted of a single turn of a 4 mm wide YBCO tape, and the generator coil used 200 turns of copper wire.

It can be seen that, in the absence of a varying magnetic field (approximately 80.5 seconds onwards), the voltage measured across the terminals 204, 206 was substantially zero. In other words, in the absence of a time-varying magnetic field, the superconducting material is superconducting. This represents the low-resistance state of the switch. In contrast when the varying magnetic field was applied (prior to 80.5 seconds) the voltage measured across the terminals fluctuated, representing a change in the resistance of the superconductive material. In addition, the peak voltage across the terminals was observed when this varying magnetic field was applied. This represents the higher-resistance state of the switch. It should be appreciated that this higher-resistance state of the switch may represent a superconducting or non-superconducting state, depending on the intended application of the switch.

Figure 6:
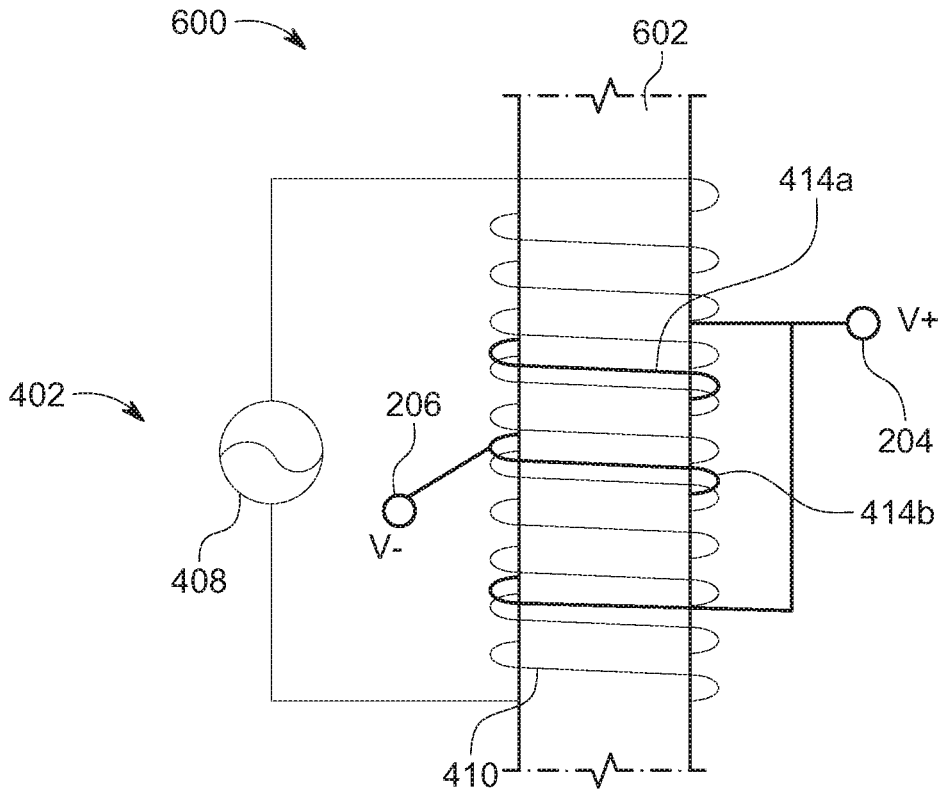
FIG. 6 shows an alternative method of coupling a magnetic field generator to a switch according to one form of the present technology.

FIG. 6 shows a yet further embodiment of a switch 600 according to the present technology. In this embodiment, the generator coil 410 of the varying magnetic field generator 402 is coaxially aligned with the coils 414a, 414b of the switch 600. This may advantageously improve the magnetic field coupling between the generator coil 410 and the superconducting coils 414a, 414b, of the switch 600.

In the illustrated embodiment, the turns of the superconducting coils 414a, 414b of the switch 600 are interlaced with the turns of the generator coil 410. However, this should in no way be seen as limiting on the technology. For example, the superconducting coils 414a, 414b may be positioned axially inside those of the generator coil 410. Alternatively, the generator coil 410 may be located axially inside the superconducting coils 414a, 414b. In a yet further alternative, the generator coil 410 may be longitudinally spaced from the coils 414a, 414b. It is also envisaged that the first superconducting coil 414a may be positioned in an alternative location to the second superconducting coil 414b; for example, the first superconducting coil 414a may be positioned under the generator coil 410, and the second superconducting coil 414b positioned above the generator coil 410.

A further advantage of coaxially aligning the generator coil 410 and the superconducting coils 414a, 414b is that a non-magnetic core or air-core 602 may be used. This can advantageously reduce the size, weight and cost of the switch. Further advantages of using an air core, such as the ability to drive higher screening currents without saturating the core should also be apparent to those skilled in the art.

6.4. Combinations of Switching Mechanisms

Forms of the technology make use of combinations of the above-described mechanisms that may be used to effect switching of an electrical switch formed from (including comprising) a superconducting material. Forms of the technology include all possible combinations of the different mechanisms, including those combinations specifically described below.

Furthermore, while operation of the different combinations of mechanisms will be described with reference to specific examples and configurations of components, other forms of the technology use other configurations of components that effect switching using the same combinations of mechanisms. For example, forms of electrical switches using the 'screening current' mechanism described above may comprise any of the forms described above, as well as others. Similarly, alternative configurations for the other switching mechanisms may also be used.

6.4.1. Combination 1—Screening Current Plus Resistive Heating

Figure 7:
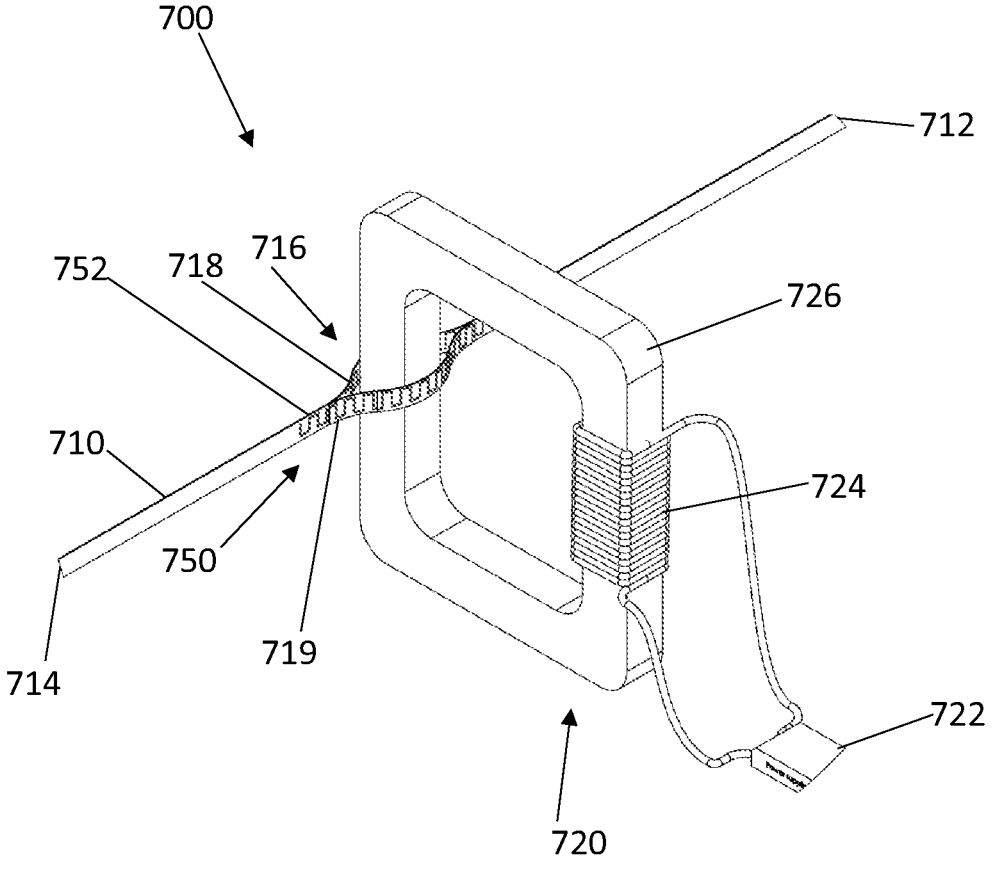
FIG. 7 is a perspective view illustration of an electrical switch according to another form of the present technology.

In certain forms of the technology there is a provided an electrical switch 700 that operates using a combination of the 'screening current' and 'heating' switching mechanisms described above. One form of such an electrical switch 700 is illustrated in FIG. 7, which is a perspective view diagram of electrical switch 700.

In the illustrated form, electrical switch 700 comprises a length of superconducting material 710 connected between two terminals 712 and 714. The length of superconducting material 710 comprises a loop 716 which comprises two electrically parallel branches of superconducting material 718 and 719. The loop 716 may be similar to the loop 210 described above in relation to FIGS. 2A-2C. The length of superconducting material 710 may take the form of a tape having two opposed faces.

In use a transport current is applied between the first terminal 712 and second terminal 714, using an electrical circuit (not shown) connected between the first and second terminals. This electrical circuit may include a power source, such as voltage or current source, a transformer or any other suitable mechanism as will be known to those skilled in the art.

Electrical switch 700 further comprises a time-varying magnetic field generator 720 configured to apply a time-varying magnetic field through the loop 716 in a direction which is normal to (or has a component which is normal to) the plane of the loop 716, i.e. parallel to an axis of the loop 716 where the axis is normal to the plane of the loop 716.

As has been described in relation to FIGS. 2A-2C above, the time-varying magnetic field applied by the time-varying magnetic field generator 720 causes a screening current to flow around between the branches 718, 719 of the loop 716 in order to oppose the flux change in the loop 716. This screening current adds to the transport current flowing around the loop 716 and as a result the total current flowing through the length of superconducting material 710 increases. If the levels of the transport current and/or screening current are suitably controlled, then the time-varying magnetic field generator 720 can cause the length of superconducting material 710 to switch from a low-resistance state to a higher-resistance state.

In the form of the technology shown in FIG. 7, the time-varying magnetic field generator 720 comprises a power supply 722, a coil 724 and a magnetic core 726. The power supply 722 is configured to generate an alternating current. In one form the power supply 722 is an alternating current source, although in other forms the power supply 722 may comprise a suitably switched direct current source.

Power supply 722 is electrically connected to a coil 724. The coil 724 may be formed of any type of conductor, including a superconductor, although in certain forms a non-superconducting conductor may be preferred for lower cost.

The coil 724 is coiled around a magnetic core 726. The magnetic core 726 may be a high-permeability magnetic core such as a ferrite core (e.g. an iron core) or a laminated steel/iron cores. In other forms, other cores of high relative permeability at the operating frequency may also be used, or a non-magnetic core or air core may be used. In the illustrated form of FIG. 7 the magnetic core 726 is a substantially ring-shaped solid core, for example a square-shaped ring having rounded corners. In the illustrated form, the coil 724 is wound around one side of the square-shaped ring core 726.

The magnetic core 726 also passes through the loop 716 of superconducting material. For example a side of the magnetic core 726 opposite to the side carrying coil 724 may pass through the loop 716. This arrangement magnetically couples the coil 724 and the loop 726. Consequently, changes in the alternating current flowing through coil 724 results in a time-varying magnetic field within magnetic core 726, and this induces the screening current in the loop 726.

Electrical switch 700 further comprises a heating assembly 750 for heating the loop 716 of superconducting material. In the form shown in FIG. 7, the heating assembly 750 comprises a resistive heating element 752 positioned in thermal contact with the loop 716 of superconducting material. For example, the resistive heating element 752 may be mounted on a surface of the loop 716 of superconducting material. The heating assembly 750 further comprises a power source (not shown) configured to supply electrical current to the resistive heating element 752.

The heating assembly 750 is configured to be selectively activated in order to heat the loop 716 of superconducting material and to thereby raise its temperature and thereby reduce the critical current. By controlled raising and/or lowering of the temperature of the loop 716 and suitable control of the transport current through the loop 716, the switch 700 can be switched between the low-resistance and the higher-resistance states. In some forms, the heating assembly 750 may be controlled according to a duty ratio, i.e. repeated switching on and off of the heating assembly 750 with the duty ratio indicating the proportion of the time that the heating assembly 750 is switched on.

In relation to electrical switch 700 there has been described two mechanisms for switching the switch 700 between the low-resistance and the higher-resistance states. The switch 700 is in the low-resistance state if both of the two mechanisms are each in the configuration corresponding to the low-resistance state of the loop 716. If either or both of the mechanisms are in a configuration that puts the loop 716 into the higher-resistance state, then the switch 700 as a whole adopts this higher-resistance state. Switching according to the 'screening current' mechanism is controlled by selective control (i.e. activation, de-activation and/or variation) of the time-varying magnetic field generator 720. Switching according to the 'heating' mechanism is controlled by selective control of the heating assembly 750. In different forms of the technology the time-varying magnetic field generator 720 and the heating assembly 750 may be controlled to be selectively controlled (e.g. activated and de-activated) independently of each other, or in combination to effect switching of the switch 700. By operating in conjunction, the two mechanisms provide advantages over each mechanism operating separately, for example by enabling faster and more efficient switching and more flexibility to switch dependent on the level of the transport current.

For example, in some forms, one of the time-varying magnetic field generator 720 and the heating assembly 750 is maintained activated, while activation and de-activation of the other of the time-varying magnetic field generator 720 and the heating assembly 750, or control of the level of activation, effects switching. In one example of such a form, the heating assembly 750 remains activated (although the degree of activation of the heating assembly 750 may vary), which reduces the critical current in the loop 716, and switching between the low-resistance and higher-resistance states is effected by the activation and de-activation of the time-varying magnetic field generator 720.

Since the energy loss in a superconducting switch is nearly proportional to the critical current in the switch during switching, using the heating assembly 750 to reduce the value of the critical current during switching reduces losses and increases the efficiency compared to the screening current mechanism operating on its own. Furthermore, the speed of switching is faster than a switch operating by a heating mechanism alone (due to the delay in heating and cooling of the superconductor when the heating assembly is activated/de-activated) and an arbitrarily small current may be switched.

In other forms, the time-varying magnetic field generator 720 and the heating assembly 750 may be activated and de-activated together in order to effect switching. In other forms, the time-varying magnetic field generator 720 and the heating assembly 750 may be activated and de-activated together at some times, and activated and de-activated separately at other times, in order to effect switching.

Control mechanisms suitable to effect switching of the time-varying magnetic field generator 720 and the heating assembly 750 are not described here, but suitable forms of control mechanisms will be appreciated by those of skill in the art.

6.4.2. Combination 2—Screening Current Plus Time-Varying Field Heating

In another form of the technology, there is provided an electrical switch similar to the switch 700 shown in FIG. 7 but with an alternative heating assembly. Except for the differences explained below, the description of switch 700 above applies to this form of the technology too. In this other form, the heating assembly comprises a second time-varying magnetic field generator (separate to the magnetic field generator 720) configured to apply a time-varying magnetic field to the loop 710. The second magnetic field generator is able to be controlled (e.g. activated and de-activated) through a suitable control mechanism in order to apply a time-varying magnetic field to the loop 710 and to effect heating of the loop 710 through the application of a time-varying magnetic field and the effects of dynamic resistance and magnetisation loss, as explained above.

In a similar manner as is described above in relation to 'combination 1', in this form, the heating assembly and the magnetic field generator may be separately and/or in combination controlled (e.g. activated, de-activated and/or varied) in order to effect switching of the electrical switch. The switch is in the low-resistance state if both of the two mechanisms are each in the configuration corresponding to the low-resistance state of the loop. If either or both of the mechanisms are in a configuration that puts the loop into the higher-resistance state, then the switch as a whole adopts this higher-resistance state.

The second magnetic field generator may be arranged so that the direction of the magnetic field applied to the loop 710 is substantially perpendicular to the two opposed flat faces of the tape. This increases the amount of dynamic resistance generated compared to fields in other directions compared to the tape surface.

6.4.3. Combination 3—Resistive Heating Plus Magnetic Field

In certain forms of the technology there is a provided an electrical switch 800 that operates using a combination of the 'magnetic field' and 'heating' switching mechanisms described above. Two forms of such electrical switches 800 are illustrated in FIGS. 8A and 8B, which are perspective view diagrams of an electrical switch 800.

Figure 8A:
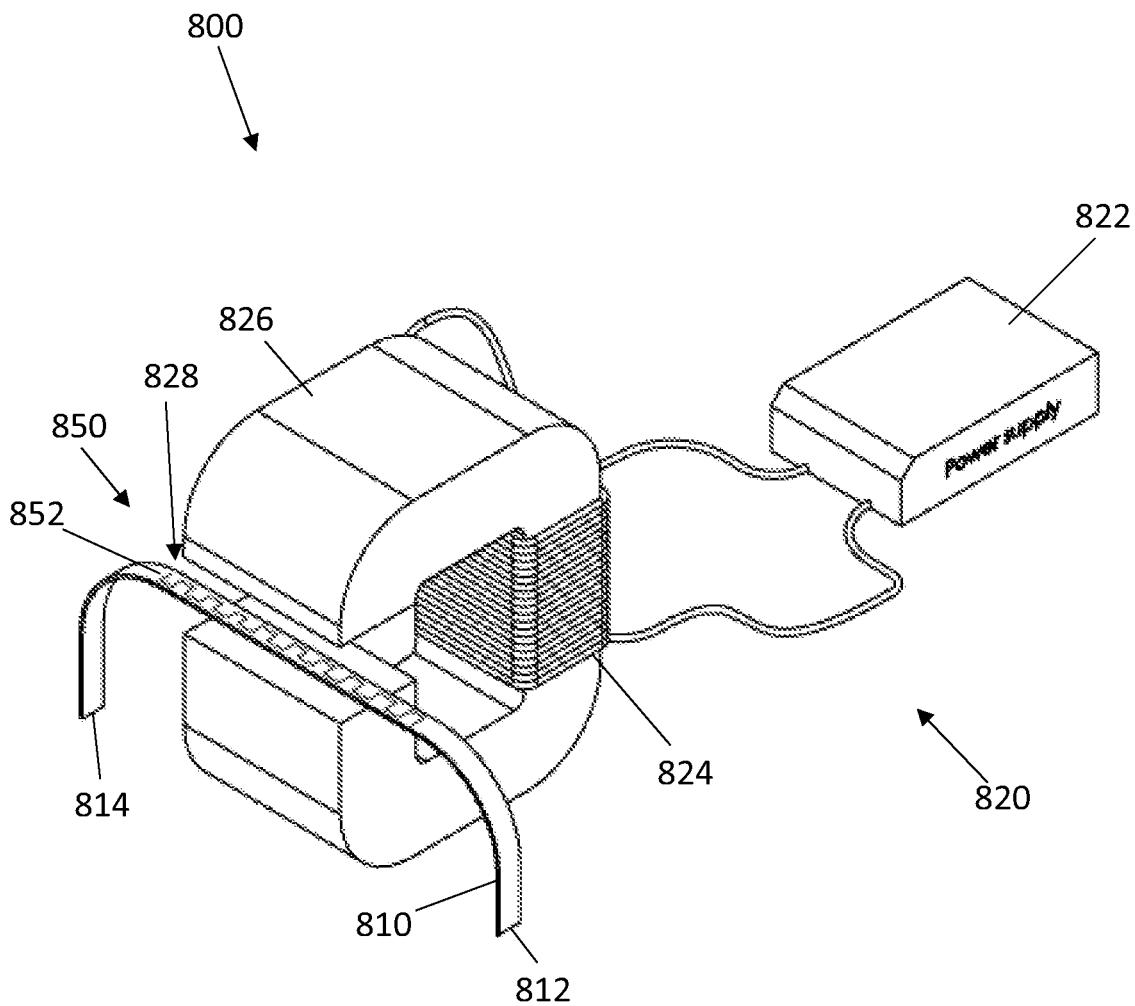
FIG. 8A is a perspective view illustration of an electrical switch according to another form of the present technology.
Figure 8B:
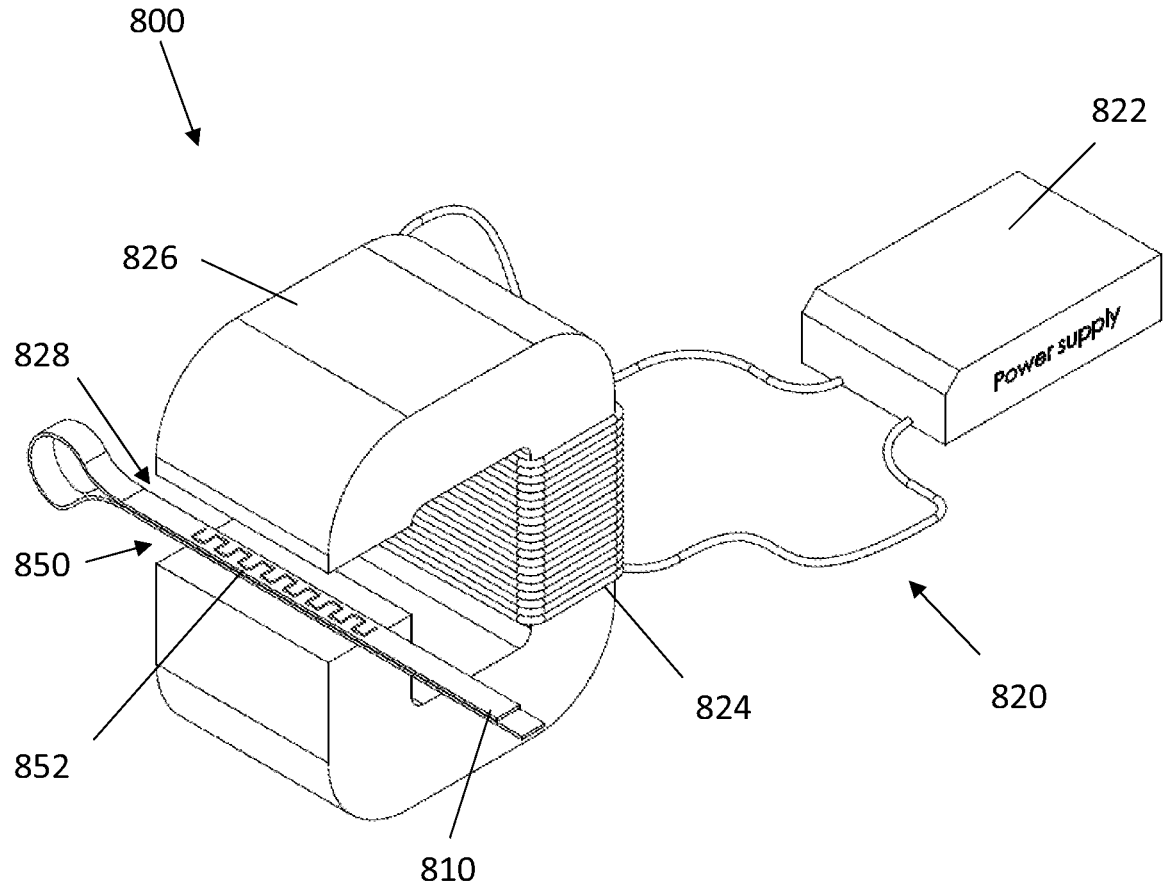
FIG. 8B is a perspective view illustration of an electrical switch according to another form of the present technology.

In the form illustrated in FIG. 8A, electrical switch 800 comprises a length of superconducting material 810 connected between two terminals 812 and 814. The length of superconducting material 810 may take the form of a tape having two opposed faces. In use a transport current is applied between the first terminal 812 and second terminal 814, using an electrical circuit (not shown) connected between the first and second terminals. This electrical circuit may include a power source, such as voltage or current source, a transformer or any other suitable mechanism as will be known to those skilled in the art.

Electrical switch 800 further comprises a magnetic field generator 820 configured to apply a magnetic field to the length of superconducting material 810. When the magnetic field is applied, the critical current of the length of superconducting material 810 is lowered, as explained in relation to FIG. 1A above. Consequently, a lower transport current is needed to approach, equal and/or exceed the critical current in order for the superconducting material to transition to the higher-resistance state than if the magnetic field is not applied.

In the form of the technology shown in FIG. 8A, the magnetic field generator 820 comprises a power supply 822 configured to generate a current. Power supply 822 is electrically connected to a coil 824. The coil 824 may be formed of any type of conductor, including a superconductor, although in certain forms a non-superconducting conductor may be preferred for lower cost.

The coil 824 is coiled around a magnetic core 826. The magnetic core 826 may be a high-permeability magnetic core such as a ferrite core (e.g. an iron core) or a laminated steel/iron cores. In other forms, other cores of high relative permeability at the operating frequency may also be used, or a non-magnetic core or air core may be used. In the illustrated form of FIG. 8A the magnetic core 826 is a substantially ring-shaped solid core, for example a square-shaped ring having rounded corners. In the illustrated form, the coil 824 is wound around one side of the square-shaped ring core 826.

In the illustrated form, the magnetic core 826 comprises a gap 828. The gap 828 may be a space in the solid magnetic core 826, for example a space in one side of the square-shaped ring core. In forms having an air core, any part of an air core may be considered to be a gap 828. In the form illustrated in FIG. 8A, the gap 828 in the magnetic core 826 is a gap in a side of the square-shaped ring that is opposite to the side around which coil 824 is wound.

In use, the coil 824 may carry a current. The flow of the current through the coil 824 generates a magnetic field, including in core 826 and across gap 828. In the illustrated form, at least part of the length of superconducting material 810 is positioned in the gap 828 such that the magnetic field generated by the magnetic field generator 820 is applied to the length of superconducting material 810. The length of superconducting material 810 may be oriented with a direction normal to the faces of the tape spanning across the gap 828 such that the magnetic field is generally perpendicular to the faces of the tape.

Electrical switch 800 further comprises a heating assembly 850 for heating the length of superconducting material 810. In the form shown in FIG. 8A, the heating assembly 850 comprises a resistive heating element 852 positioned in thermal contact with the length of superconducting material 810. For example, the resistive heating element 852 may be mounted on a surface of the length of superconducting material 810. The heating assembly 850 further comprises a power source (not shown) configured to supply electrical current to the resistive heating element 852.

The heating assembly 850 is configured to be selectively controlled (e.g. activated) in order to heat the length of superconducting material 810 and to thereby raise its temperature and thereby reduce the critical current. By controlled raising and/or lowering of the temperature of the superconducting material and suitable control of the transport current, the switch 800 can be switched between the low-resistance and the higher-resistance states. In some forms, the heating assembly 850 may be controlled according to a duty ratio, i.e. repeated switching on and off of the heating assembly 850 with the duty ratio indicating the proportion of the time that the heating assembly 850 is switched on.

FIG. 8B illustrates an electrical switch 800 that is very similar to the electrical switch shown in FIG. 8A. In the electrical switch 800 shown in FIG. 8B, however, the length of superconducting material 810 is arranged in a bifilar arrangement in the gap 828 of magnetic core 826. Bifilar arrangements are described in more detail later in this specification.

In relation to electrical switch 800 there has been described two mechanisms for switching the switch 800 between the low-resistance and the higher-resistance states. The switch 800 is in the low-resistance state if both of the two mechanisms are each in the configuration corresponding to the low-resistance state of the length of superconducting material 810. If either or both of the mechanisms are in a configuration that puts the material into the higher-resistance state, then the switch 800 as a whole adopts this higher-resistance state. Switching according to the 'magnetic field' mechanism may be controlled by selective activation, de-activation and/or variation of the magnetic field generator 820. Switching according to the 'heating' mechanism is controlled by selective activation, de-activation and/or variation of the heating assembly 850. In different forms of the technology the magnetic field generator 820 and the heating assembly 850 may be controlled (e.g. selectively activated and de-activated) independently of each other, or in combination to effect switching of the switch 800.

For example, in some forms, one of the magnetic field generator 820 and the heating assembly 850 is maintained activated, while activation and de-activation of the other of the magnetic field generator 820 and the heating assembly 850, or controlling the level of activation, effects switching. In one example of such a form, the heating assembly 850 remains activated (although the degree of activation of the heating assembly 850 may vary), which reduces the critical current in the length of superconducting material 810, and switching between the low-resistance and higher-resistance states is effected by the activation and de-activation of the magnetic field generator 820. Since the energy loss in a superconducting switch is nearly proportional to the critical current in the switch during switching, using the heating assembly 850 to reduce the value of the critical current during switching reduces losses and increases the efficiency compared to the magnetic field mechanism operating on its own.

In other forms, the magnetic field generator 820 and the heating assembly 850 may be activated and de-activated together in order to effect switching. In other forms, the magnetic field generator 820 and the heating assembly 850 may be activated and de-activated together at some times, and activated and de-activated separately at other times, in order to effect switching.

Figure 9:
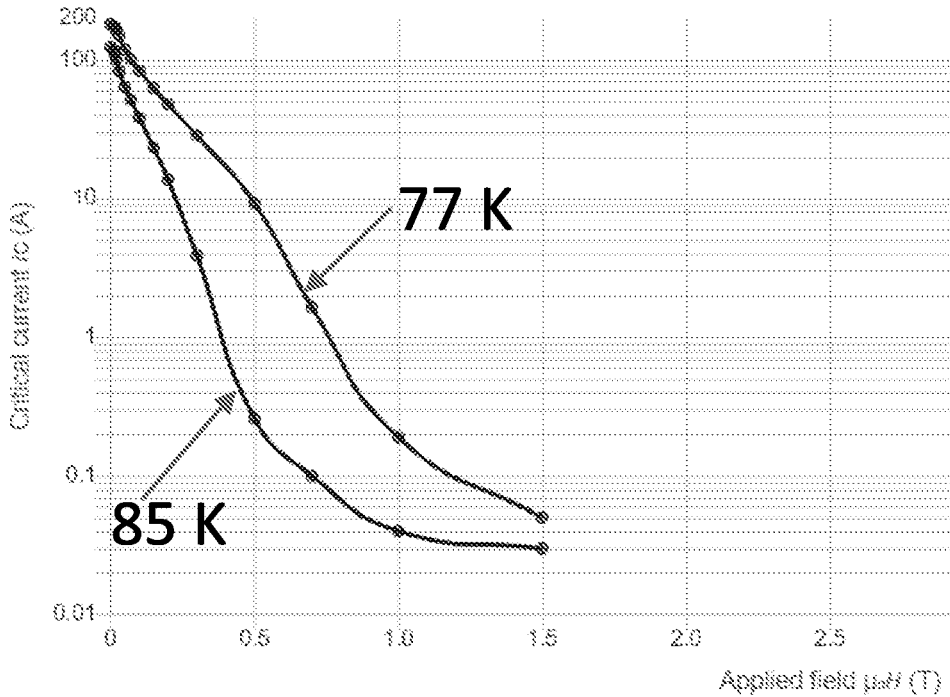
FIG. 9 is a graph showing the relationship between critical current and applied field for a high-temperature superconductor at two different temperatures.

By operating in conjunction, the two mechanisms provide advantages over each mechanism operating separately. For example, superconductors typically have a different relationship between the critical current and the applied external magnetic field at different temperatures. FIG. 9 is a graph showing the relationship between critical current and applied field for a high-temperature superconductor at two different temperatures: 77K and 85K. It can be seen from this graph that, at a higher temperature, a lower magnitude of applied magnetic field is needed to reduce the critical current of the superconductor to the same magnitude. Consequently, by combining the two switching mechanisms, for example by using the heating assembly 850 to heat up the superconductor by several degrees, easier and/or faster switching can be achieved with a change to the applied magnetic field than at a lower temperature. This also increases the resistance in the higher-resistance state compared to only using the magnetic field to reduce the critical current at a lower temperature, whereas the current capacity is the low-resistance state remains the same. The lack of phase transition between the two states also enables faster and easier switching than, for example, a switch operated by activation and de-activation of only a heating assembly. One disadvantage with the form of switch 800 is that an arbitrarily small current may not be switched unless the temperature exceeds the critical temperature.

Control mechanisms suitable to effect switching of the time-varying magnetic field generator 820 and the heating assembly 850 are not described here, but suitable forms of control mechanisms will be appreciated by those of skill in the art.

6.4.4. Combination 4—Resistive Heating Plus Dynamic Resistance

In another form of the technology there is a provided an electrical switch that operates using a combination of the 'resistive heating' and 'dynamic resistance' switching mechanisms described above. The electrical switch in this form is similar to switch 800 shown in FIG. 8A or 8B and, except for the differences explained below, the description of switch 800 above applies to this form of the technology too.

In this form, the magnetic field generator 820 is a time-varying magnetic field generator configured to apply a time-varying magnetic field to the length of superconducting material. For example, the power supply 822 may be configured to generate an alternating current, for example the power supply 722 may be an alternating current source or a suitably switched direct current source. By applying a time-varying magnetic field, the dynamic resistance phenomenon may be triggered, and the time-varying magnetic field generator is controlled together with the heating assembly comprising a resistive heating element in order to selectively switch the length of superconducting material between the low-resistance and higher-resistance states, in a similar manner to that explained above in relation to other forms of the technology.

In one form, the heating assembly 850 is activated in order to heat the length of superconducting material 810 in order to reduce its critical current. Then the time-varying magnetic field generator can be controlled (e.g. activated and deactivated) in order to selectively switch the electrical switch 800. By using the resistive heating mechanism to reduce the critical current, the loss from dynamic resistance switching may be reduced compared to dynamic resistance switching without using the resistive heating mechanism to reduce the critical current.

6.4.5. Combination 5—Magnetic Field Plus Dynamic Resistance (DC and AC Field)

Figure 10A:
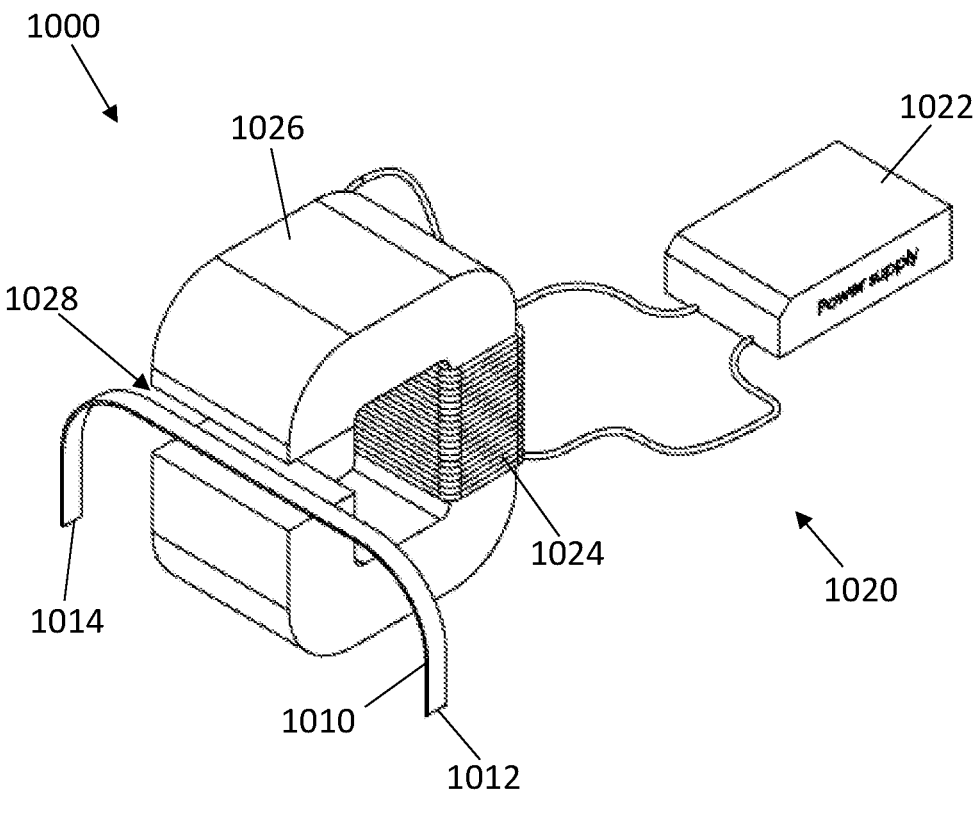
FIG. 10A is a perspective view illustration of an electrical switch according to another form of the present technology.
Figure 10B:
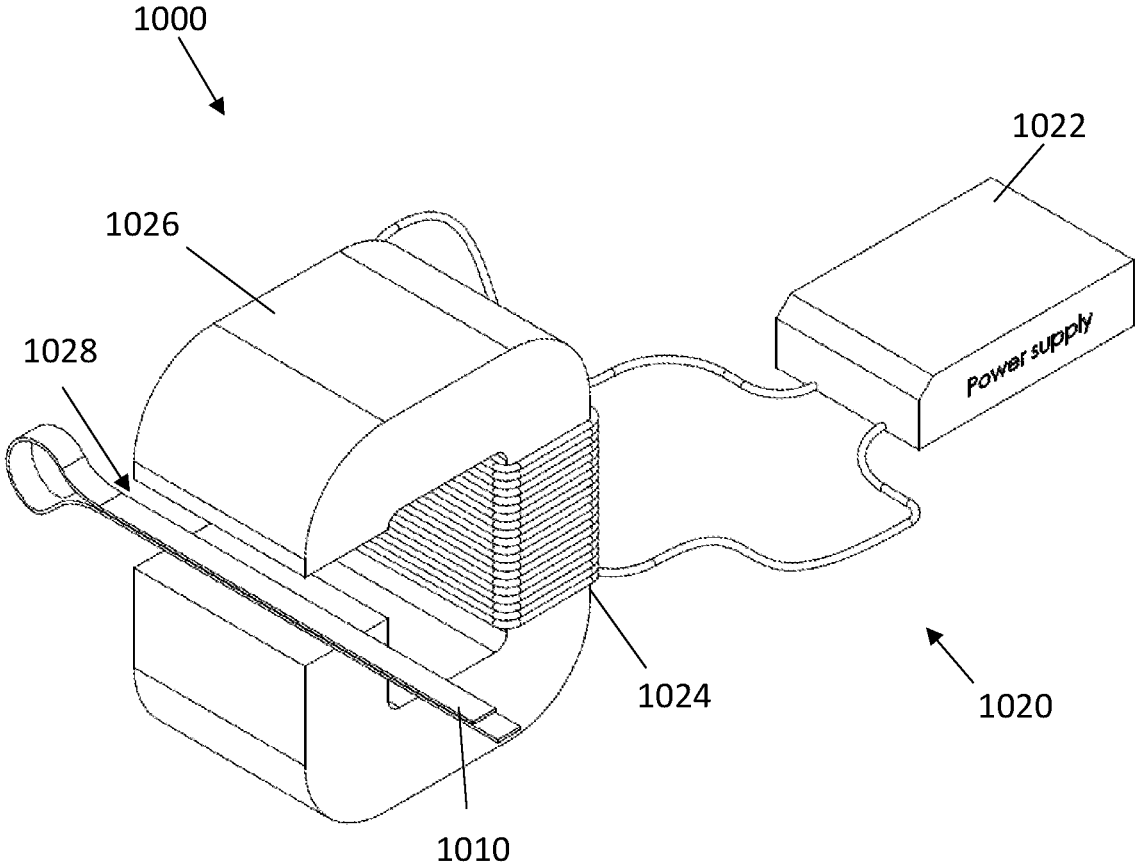
FIG. 10B is a perspective view illustration of an electrical switch according to another form of the present technology.

In certain forms of the technology there is a provided another electrical switch 1000 that operates using a combination of the 'magnetic field' and 'dynamic resistance' switching mechanisms described above. Two forms of such electrical switches 1000 are illustrated in FIGS. 10A and 10B, which are perspective view diagrams of electrical switch 1000. The electrical switch 1000 is similar to switches 800 shown in FIG. 8A or 8B and, except for the differences explained below, the description of switches 800 above applies to this form of the technology too (with appropriate changes to the reference numerals).

Unlike electrical switch 800 shown in FIGS. 8A and 8B, electrical switch 1000 does not comprise a resistive heating element 852. Instead, some heating of the length of superconducting material 1010 occurs through the effects of the dynamic resistance phenomenon and magnetisation when a time-varying magnetic field is applied by magnetic field generator 1020. Consequently, magnetic field generator 1020 may be considered as also serving as a heating assembly in this form of the technology.

FIG. 10B illustrates an electrical switch 1000 that is very similar to the electrical switch shown in FIG. 10A. In the electrical switch 1000 shown in FIG. 10B, however, the length of superconducting material 1010 is arranged in a bifilar arrangement in the gap 1028 of magnetic core 1026. Bifilar arrangements are described in more detail later in this specification.

Figure 11:
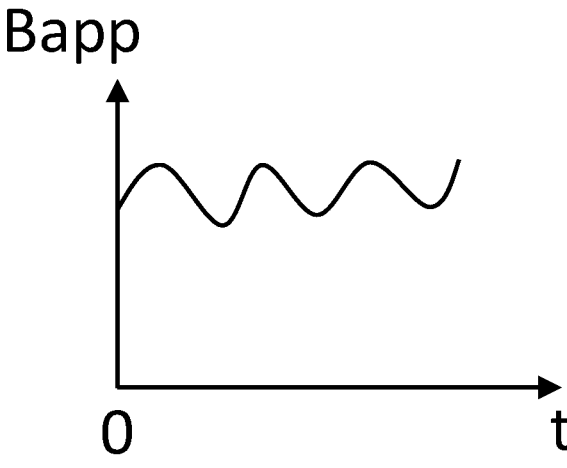
FIG. 11 is a graph of magnetic field strength generated by a magnetic field generator against time according to one form of the technology.

To achieve switching of the electrical switch 1000 through the two mechanisms, magnetic field generator 1020 is configured to generate, and apply to the length of superconducting material 1010, a magnetic field that varies in amplitude over time with a DC bias. One example of the variation of magnetic field strength $B_{app}$ generated by magnetic field generator 1020 with time t is illustrated in FIG. 11. Such a field may be generated by suitable control of the current generated by power supply 1022, for example by generating a current having a waveform similar to that shown in FIG. 11.

In use a control mechanism is configured to control the magnetic field generator 1020 to vary the magnitude of the magnetic field applied to the length of superconducting material 1010 over time in order to achieve the desired switching using the two switching mechanisms. That is, the level of the DC bias can be selectively varied in order to raise or lower the critical current of the superconductor based on the magnitude of the applied magnetic field. Furthermore, the time-varying component of the magnetic field strength can be selectively controlled (e.g. varied, activated, de-activated) in order to vary the amount of dynamic resistance created and consequently to vary the resistance of the superconducting material 1010. The control mechanism is configured to control the magnetic field strength in order to use the two switching mechanisms independently or in combination to transition electrical switch 1000 between the low-resistance and higher-resistance state, as required. The switch 1000 is in the low-resistance state if both of the two mechanisms are each in the configuration corresponding to the low-resistance state. If either or both of the mechanisms are in a configuration that puts the superconductor into the higher-resistance state, then the switch 1000 as a whole adopts this higher-resistance state.

For example, in some forms, one of the time-varying component or the DC bias component of the magnetic field applied by the magnetic field generator 1020 is maintained activated, while activation and de-activation of the other component of the magnetic field, or control of the level of activation, effects switching.

In one example of such a form, the magnetic field generator 1020 is configured to maintain the DC bias component of the magnetic field in order to reduce the critical current in the length of superconducting material 1010, and switching between the low-resistance and higher-resistance states is effected by the magnetic field generator 1020 activating and de-activating the time-varying component of the magnetic field in order to selectively trigger dynamic resistance. By using the DC bias component to reduce the critical current, the amount of heat loss caused by dynamic resistance in the length of superconducting material 1010 is less than if the dynamic resistance effect was used alone as the switching mechanism.

In another example of such a form, the magnetic field generator 1020 is configured to maintain the time-varying (e.g. alternating) component of the magnetic field activated (although the degree of activation may vary), which creates dynamic resistance and also reduces the critical current in the length of superconducting material 1010 through heating caused by dynamic resistance and magnetisation, and switching between the low-resistance and higher-resistance states is effected by the magnetic field generator 1020 activating and de-activating the DC bias component of the magnetic field.

Since the energy loss in a superconducting switch is nearly proportional to the critical current in the switch during switching, using the time-varying component of the magnetic field generator 1020 as a heating assembly to reduce the value of the critical current during switching reduces losses and increases the efficiency compared to the DC bias component of the magnetic field operating on its own. Furthermore, the switching speed is increased compared to the DC bias component operating on its own. In addition, an arbitrarily small current can be switched with this combination of mechanisms.

6.4.6. Combination 6—Magnetic Field Plus Resistive Heating Plus Dynamic Resistance In another form of the technology there is a provided an electrical switch that operates using a combination of the 'resistive heating', 'dynamic resistance' and 'magnetic field' switching mechanisms described above. The electrical switch in this form is similar to switch 800 shown in FIG. 8A or 8B and, except for the differences explained below, the description of switch 800 above applies to this form of the technology too.

In this form, the magnetic field generator is configured to generate, and apply to the length of superconducting material, a magnetic field that varies in amplitude over time with a DC bias. One example of the variation of magnetic field strength $B_{app}$ generated by the magnetic field generator with time t is illustrated in FIG. 11. Such a field may be generated by suitable control of the current generated by the power supply, for example by generating a current having a waveform similar to that shown in FIG. 11.

In use a control mechanism is configured to control the magnetic field generator to vary the magnitude of the magnetic field applied to the superconducting material in a similar way to that described in relation to the fifth combination described above. In addition, the control mechanism is also configured to control the heating assembly to vary the temperature of the superconducting material. In this way, three mechanisms may be used to achieve switching of the electrical switch and the magnetic field generator and heating assembly may be controlled to achieve switching in the manner desired.

In this form, the switch is in the low-resistance state if all three of the mechanisms are each in the configuration corresponding to the low-resistance state. If any one or more of the mechanisms are in a configuration that puts the superconductor into the higher-resistance state, then the switch as a whole adopts this higher-resistance state.

Figure 12:
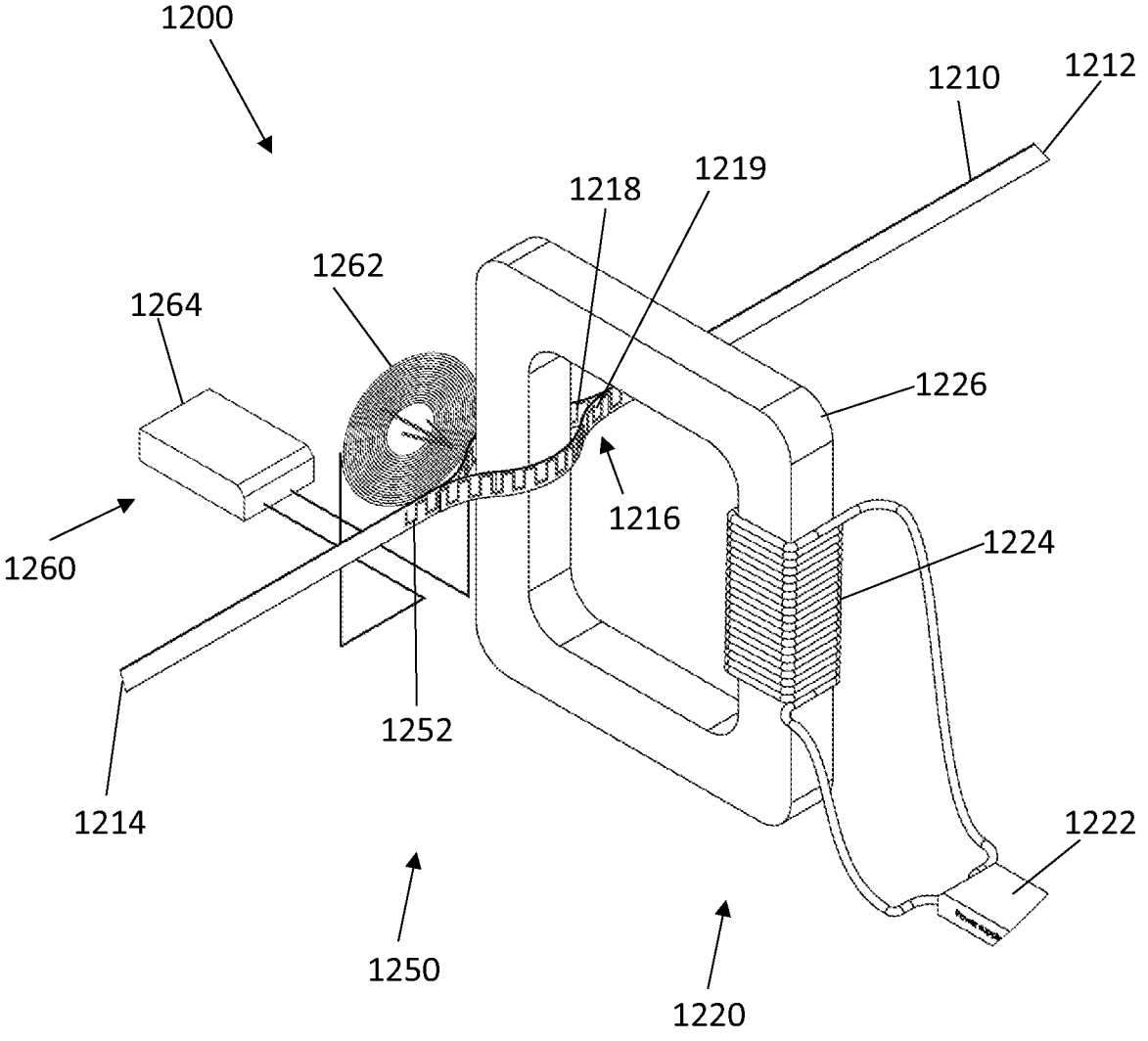
FIG. 12 is a perspective view illustration of an electrical switch according to another form of the present technology.

6.4.7. Combination 7—Magnetic Field Plus Resistive Heating Plus Dynamic Resistance Plus Screening Current In another form of the technology there is a provided an electrical switch that operates using a combination of the 'resistive heating', 'dynamic resistance', 'magnetic field' and 'screening current' switching mechanisms described above. One form of such a switch 1200 is shown in FIG. 12. The electrical switch 1200 in this form is similar to switch 700 shown in FIG. 7 and, except for the differences explained below, the description of switch 700 above applies to this form of the technology too (with appropriate changes to the reference numbers).

In addition to the components shown and described in relation to FIG. 7, electrical switch 1200 further comprises a magnetic field generator 1260. Magnetic field generator 1260 is configured to apply a magnetic field to the loop 1216 of superconducting material. The magnetic field applied by magnetic field generator 1260 may be time-varying (e.g. alternating), constant (i.e. DC, including a constant DC field that is able to vary between constant values) or time-varying with a DC bias. This enables the magnetic field generator 1260 to selectively contribute either or both of the 'magnetic field' or 'dynamic resistance' mechanisms to effect switching of the electrical switch 1200.

Magnetic field generator 1260 may comprise a power supply 1264 configured to generate a current, for example a direct current, an alternating current and/or an alternating current with a DC bias. Magnetic field generator 1260 may also comprise coil 1262. Coil 1262 may comprise a conductor wound in a coil and electrically connected to power supply 1264. Coil 1262 may be positioned and oriented relative to the loop 1216 in order to apply a magnetic field to the loop 1216 where the direction of the magnetic field is generally perpendicular to the flat opposed surfaces of the tape of superconducting material forming the loop 1216. For example, the coil 1262 may define an axis and the axis is perpendicular to the flat opposed surfaces of the tape.

In use a control mechanism is configured to control the magnetic field generator 1260 to vary the magnitude of the magnetic field applied to the superconducting material in a similar way to that described in relation to the fifth combination described above. In addition, the control mechanism is also configured to control the heating assembly 1250 to vary the temperature of the superconducting material as described in relation to any of the forms of the technology using the 'resistive heating' mechanism described above. In addition, the control mechanism is configured to control the magnetic field generator 1220 to generate a screening current as described in relation to any of the forms of the technology using the 'screening current' mechanism described above. In this way, four mechanisms may be used to achieve switching of the electrical switch 1200, and the magnetic field generators 1260 and 1220 and the heating assembly 1250 may be controlled independently and/or in any combination to achieve switching using any combination of the four mechanisms in the manner desired.

In this form, the switch is in the low-resistance state if all four of the mechanisms are each in the configuration corresponding to the low-resistance state. If any one or more of the mechanisms are in a configuration that puts the superconductor into the higher-resistance state, then the switch as a whole adopts this higher-resistance state.

The following factors are relevant to the combination of mechanisms used in electrical switch 1200 (or any of the other combinations of mechanisms described herein):

The 'magnetic field' mechanism may not be able to switch an arbitrarily small current itself and, in the case of a high-temperature superconductor (HTS), would need an impracticably high current to effect switching itself. However fields of a practical magnitude can be applied to a HTS to reduce the critical current sufficiently for another mechanism to effect switching and by reducing the critical current this reduces switching losses;

The 'dynamic resistance' switching mechanism is able to switch arbitrarily small currents and may be able to achieve a highly controllable resistance in the higher-resistance state. But such a switch may be highly inductive and may need a large power to drive the magnetic field generator quickly. The switching loss may be positively related to the critical current of the superconductor. The mechanism generates inductive heating to increase the temperature of the superconductor which, as has been described, may facilitate the 'magnetic field' mechanism;

Thermal switching using the 'heating—resistive element' option by itself may be very slow, and the necessary change in temperature between the higher-resistance and low-resistance states may result in high heat losses. But the mechanism can be used to increase the temperature of the superconductor to reduce the demand on the field in the 'magnetic field' mechanism and may reduce the critical current to reduce losses for other switching mechanisms, for example the 'screening current' and/or 'dynamic resistance' mechanisms; and The 'screening current' mechanism is non-inductive so is relatively easy to drive and achieve fast switching and generate a high resistance in the higher-resistance state. The switching loss is positively related to the critical current of the superconductor, but using the 'magnetic field' or 'resistive element' heater mechanisms to reduce the critical current may help to reduce the switching losses.

It should be appreciated that any one or more of the four mechanisms described in relation to this form of the technology can be omitted in other forms of the technology. That is, in certain forms, there is provided an electrical switch similar to electrical switch 1200 shown in FIG. 12 only with any one or more of the following mechanisms omitted (e.g. either because the components to enable that mechanism are not present or because those components are de-activated/not used): 'magnetic field'; 'resistive heating'; 'heating—dynamic resistance; and 'screening current'.

6.4.8. Combination 8—Magnetic Field Plus Screening Current

In one specific such example a form of the technology provides an electrical switch which operates using the 'magnetic field' and 'screening current' mechanisms. Such an electrical switch has a form similar to that of electrical switch 1200 shown in FIG. 12 only with the heating assembly 1250 (comprising the resistive heating element 1252) omitted.

In this form, the switch 1200 can be switched by selective control (e.g. variation/activation/de-activation) of either or both the magnetic field generator 1220 and/or the magnetic field generator 1260 in order to raise or lower the critical current in relation to the transport current. These mechanisms can be controlled independently or in combination. In one example, the magnetic field generator 1220 remains activated and the magnetic field generator 1260 is selectively activated and de-activated, or the level of activation is varied, to effect switching. In another example it is vice versa, i.e. the magnetic field generator 1260 remains activated and the magnetic field generator 1220 is selectively activated and de-activated, or the level of activation is varied, to effect switching.

6.5. Bifilar Arrangement

Forms of the technology have been described that relate to electrical switches 210 that utilise the principle that the critical current of a superconducting material decreases as a higher external magnetic field is applied to the material.

Two exemplary such electrical switches 800 and 1000 are illustrated in FIGS. 8A and 10A respectively. The switches in these figures comprise a length of superconducting material arranged in a unifilar arrangement. That is, an arrangement of a single length or strand of conductor.

In the similar forms of the technology shown in FIGS. 8B and 10B, electrical switches 800 and 1000 take forms similar to those shown in FIGS. 8A and 10A but comprising a length of superconducting material 810 and 1010 arranged in a bifilar arrangement. Another exemplary bifilar arrangement is shown in FIG. 13. This aspect of the technology will now be described in more detail.

It should be understood that, while a bifilar arrangement of the length of superconducting material is described in relation to the forms of electrical switch shown in FIGS. 8B, 10B, 36A and 36B, the bifilar arrangement may also be applied to other forms of the technology. In particular, any of the electrical switches described in this specification may, in alternative forms of the technology, where appropriate, comprise a length of superconducting material arranged in a bifilar arrangement.

In the context of this specification, unless otherwise stated, a "bifilar arrangement" should be understood to mean an arrangement of two strands of a conductor in which the two strands of the conductor are substantially parallel and electrically connected so that current flows through the strands in opposite directions. The strands may be closely adjacent to each other. The strands may be two sections of a length of superconducting material that is doubled back on itself. Alternatively, the two strands may be separate lengths of superconducting material that are electrically connected together, for example by soldering, diffusion joint or other suitable form of electrical connection.

It should also be understood that, in certain forms of the technology, multiple bifilar strands may be used. Therefore, unless the context clearly requires otherwise, where a bifilar arrangement is described, other forms of the technology may include a similar arrangement with multiple bifilar strands.

Figure 13A:
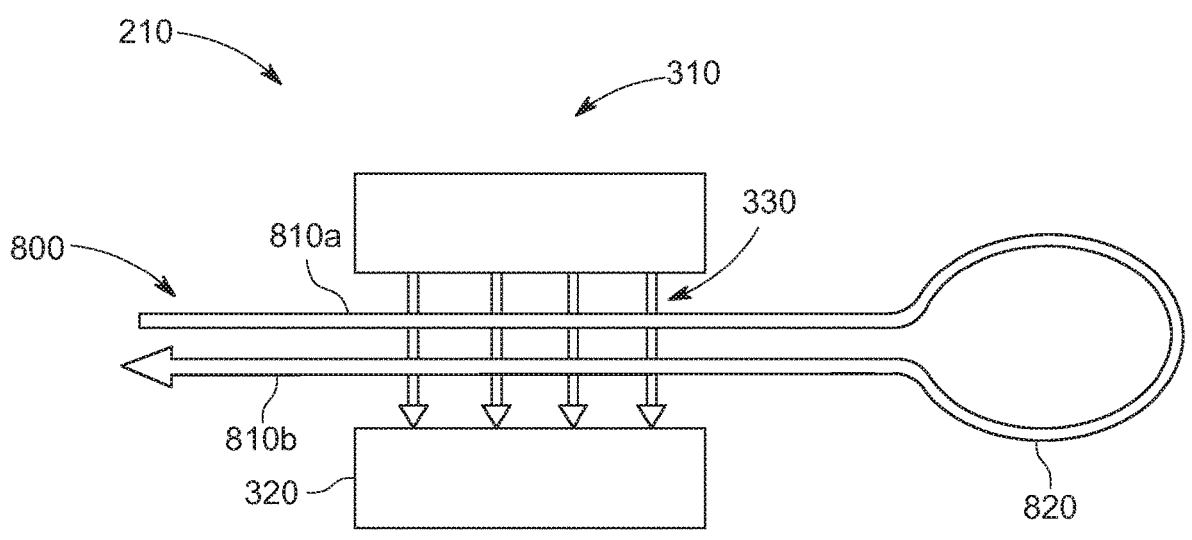
FIG. 13A is a schematic illustration of an electrical switch according to one form of the technology.

More particularly, for example referring to the form of the technology illustrated in FIG. 13A, in one form of bifilar arrangement, an electrical switch 1210 comprises a length 1800 of superconducting material. The length 1800 of superconducting material comprises two strands (i.e. sublengths) 1810*a* and 1810*b* of superconducting material. The two strands 1810*a* and 1810*b* are connected in series to each other. The length 1800 of superconducting material is arranged so that it doubles back on itself and the two strands 1810*a* and 1810*b* are spatially arranged substantially parallel to each other. In this arrangement, when the length 1800 of superconducting material is carrying a transport current, the current in the first strand 1810*a* flows in the opposite direction to the current in the second strand 1810*b*. A fold region 1820 (which may take the form of a loop) of the length 1800 of superconducting material may separate the two strands 1810*a* and 1801*b* along the length of the length 1800 of superconducting material. It will be appreciated that this description also applies to the forms of the technology illustrated in FIGS. 8B and 10B.

Figure 13B:
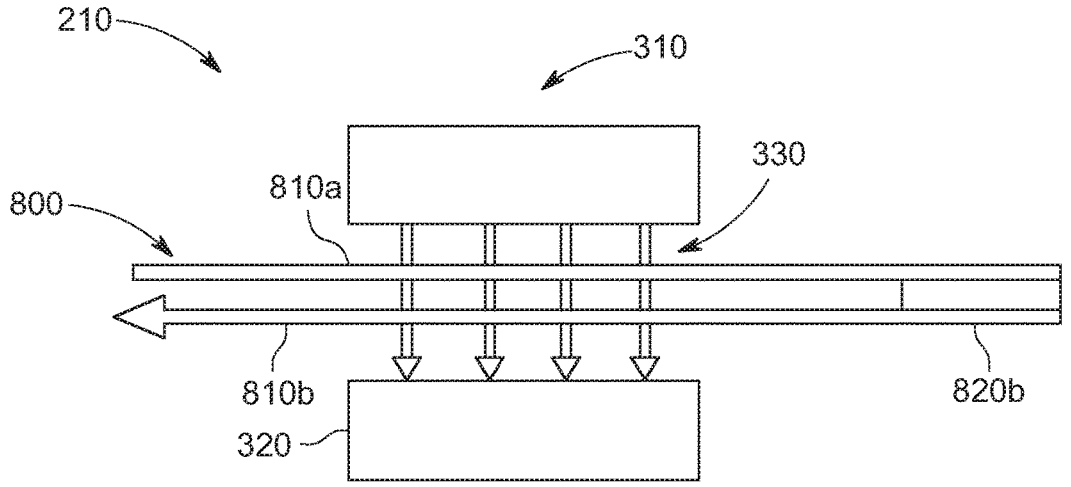
FIG. 13B is a schematic illustration of an electrical switch according to another form of the technology.

In the alternative form of the technology shown in FIG. 13B, electrical switch 1210 comprises two separate strands 1810*a* and 1810*b* of superconducting material. One end of each of the two strands 1810*a* and 1810*b* are electrically connected together at electrical connection 1820*b* and the two strands are in a bifilar arrangement. Again, in this arrangement, when the length 1800 of superconducting material is carrying a transport current, the current in the first strand 1810*a* flows in the opposite direction to the current in the second strand 1810*b*. The electrical connection 1820*b* may be a solder joint, a diffusion joint, or any suitable electrical joint.

In the forms of the technology shown in FIGS. 13A and 13B, the two strands 1810*a* and 1810*b* may also be arranged closely adjacent to each other. An insulation coating may be applied to one or both of the strands 1810*a* and 1810*b* and the insulating coatings of the strands may be in contact with each other. Alternatively, an insulating layer may be placed between the two strands 1810*a* and 1810*b* in contact with one or both strands. The insulating layer may be formed of an insulating tape, for example Kapton or Nomex tape.

In certain forms of the technology, the length 1800 of superconducting material may take the form of a tape, i.e. a length of material having a length that is significantly larger than its width and its depth, and a width that is significantly larger than its depth. The tape may have two substantially parallel opposed faces, where the faces are separated by the depth of the tape. The strands may be arranged so that the opposed faces of one strand 1810*a* are parallel with the opposed faces of the other strand 1810*b*. In the form of the technology shown in FIG. 13B, each of the two strands 1810*a* and 1810*b* may take the form of a tape. The two separate strands may be electrically connected (e.g. soldered) face-to-face at one end to form an electrically continuous joint 1820*b*. This arrangement may reduce the inductance of electrical switch 1210, although this benefit may be achieved at the expense of a small increase in the resistance of the low-resistance state. Alternatively, a single length of superconducting material (e.g. tape) may be arranged with the two strands 10*a* and 810*b* as adjacent sections of the length joined end-to-end.

In certain forms of the technology, the length 1800 of superconducting material may be a length of high temperature superconducting (HTS) material, as explained earlier.

As shown in the forms of the technology in FIGS. 13A and 13B, an electrical switch 1210 of certain forms of the technology may be arranged such that a magnetic field generator 1310 is able to be activated to apply a magnetic field to the two strands 1810*a* and 1801*b* of superconducting material. The magnetic field generator 1310 may take the form of any of the magnetic field generators described earlier in this specification. The magnetic field generator 1310 may be selectively controlled to selectively generate a magnetic field in order to cause the electrical switch 1210 to move between a low-resistance state and a higher-resistance state in the manner explained earlier, including in combination with other switching mechanisms as explained earlier.

In certain forms, the magnetic field generator 1310 comprises a magnetic core 1320. The core 1320 may be a high-permeability magnetic core such as a ferromagnetic core, for example a ferrite core (e.g. an iron core) or a laminated steel/iron core. The magnetic core 1320a may be a substantially ring-shaped solid core, for example a circular ring. In other forms, the core may have a different shape, for example a square-shaped ring having rounded corners. In the exemplary forms, the magnetic core 1320 comprises first and second ends separated by a gap 1330. The gap 1330 may be a space in a solid magnetic core 1320, for example a space in one side of a ring core.

In certain forms, the electrical switch 1210 is arranged so that the magnetic field generated by the magnetic field generator 1310 is substantially perpendicular to the opposed faces of the strands 1810a and 1801b. That is, the lines of magnetic flux of the magnetic field are substantially perpendicular to the faces of the strands 1810a and 1801b where the lines of flux intersect the strands.

In certain forms of the technology, the width of the gap 1330 is similar to the combined depth of the two strands 1810a and 1810b, i.e. there is relatively little air gap separating each of the strands 1810a and 1810b from the respective end of the core 1330 nearest to the strand.

It should be appreciated that the forms of electrical switches shown in FIGS. 13A and 13B show only the components required to perform the 'magnetic field' switching mechanism. This is for the purposes of illustrating the bifilar arrangement. In certain forms of the technology, electrical switches comprising a bifilar arrangement of a superconducting material comprise the components necessary to effect second or further switching mechanisms, in the manner described above.

One benefit of an electrical switch 1210 comprising a bifilar arrangement of a length of superconducting material is that the inductance of the switch is reduced compared to a similar switch with a single length of superconducting material. One practical advantage of this may be that a coil 1340 of the magnetic field generator 1310 applying a magnetic field to the electrical switch 1210 may have fewer turns than would otherwise need to be the case.

Another benefit of an electrical switch 1210 comprising a bifilar arrangement of a length of superconducting material is that it assists in reducing suppression of the critical current of the length of superconducting material when the magnetic field applied to the length of superconducting material is low, for example zero. This leads to a higher critical current for the low-resistance state of the switch 1210. This effect will now be explained in more detail.

Forms of the technology described above comprise electrical switches 1210 in which a magnetic field is applied to a length of superconducting material in order to suppress the critical current in the length of superconducting material. This effect is used in some forms of the technology to transition the length of superconducting material between a low-resistance state and a higher-resistance state. The magnetic field generator 1310 that generates the magnetic field may comprise a high-permeability core 1320, for example a ferromagnetic core, which may be used to focus the magnetic field onto the length of superconducting material.

It has been observed that, when a single length of superconducting material carrying a transport current is placed proximate a ferromagnetic core, there is additional suppression of the critical current, even when the strength of the magnetic field is low, including zero. In fact, the relative additional suppression of the critical current as a result of this effect is greater when the applied magnetic field strength is lower. This is due to a self-field magnification effect caused by the proximity of ferromagnetic material in the core 1320 to the superconducting material when current is flowing. More particularly, it has been identified, through experimentation and finite element analysis, that the presence of a low-reluctance return path through the ferromagnetic core 1320 causes the self-field of a unifilar length of superconducting material to be amplified and, where the unifilar length of superconducting material is in the form of a tape, to be oriented perpendicular to the tape and to be spread across its width. This causes suppression of the critical current density of each point across the width of the tape, and hence suppression of the total critical current compared to when no ferromagnetic core is present.

Figure 14:
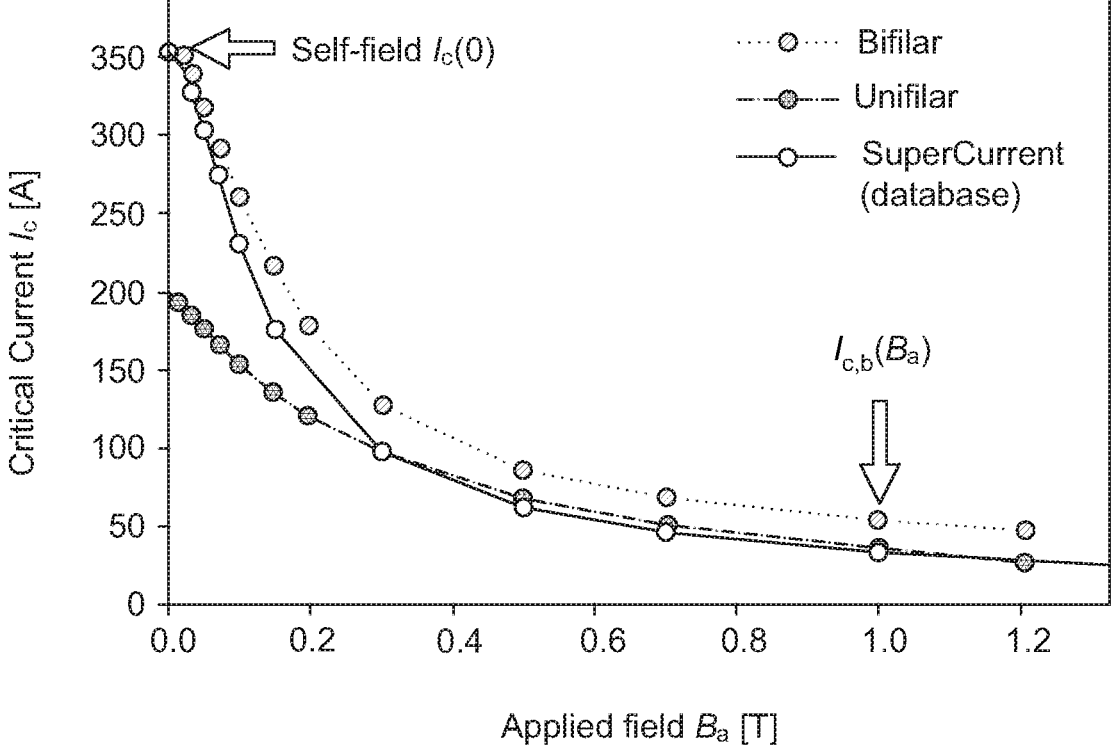
FIG. 14 is a graph illustrating the relationship between critical current of a length of superconducting material in an electrical switch according to a form of the technology at different applied fields and when the length of superconducting material is arranged in a bifilar arrangement and a unifilar arrangement.

It has further been identified that an electrical switch 1210 in which the length of superconducting material is arranged in a bifilar arrangement significantly mitigates against this effect, i.e. it reduces the described suppression of the critical current. Put another way, the bifilar arrangement substantially cancels the self-magnetic field generated by the current flowing through the length of superconducting material when in proximity to the ferromagnetic core 1320. FIG. 14 illustrates the critical current of a length of superconducting material in an electrical switch 1210 according to a form of the technology at different applied fields and when the length of superconducting material is arranged in a bifilar arrangement (blue, top line) and a unifilar arrangement (orange, bottom line), i.e. a single layer of a length of superconducting material. These experimental results are compared to reference values for the superconducting material from a database (green, dashed, middle line). This illustrates that the suppression of the critical current at low applied fields is very low for the bifilar arrangement compared to the unifilar arrangement. The difference is less significant at higher applied fields where the applied magnetic field is significantly larger than any self-field effects. The relatively small difference in the critical current at higher applied fields may be due to an increase in the shielding capability of the two-layer bifilar arrangement compared to the single layer unifilar arrangement. It should be appreciated that the length of superconducting material may be maintained in a superconducting state at all times in certain forms of the technology.

A greater difference between the critical current for low applied magnetic fields compared to high applied magnetic fields means that an electrical switch 1210 comprising a length of superconducting material in a bifilar arrangement may have an improved switching performance compared to, for example, a switch with a unifilar arrangement. The switching performance may be given by a switching factor $\kappa$, which may calculated as the ratio of the critical current when the magnetic field is zero to the critical current when the magnetic field is applied, i.e. $I_c(0)/I_{c,b}(B_a)$. It can be seen from FIG. 14 that K is greater for the bifilar arrangement than the unifilar arrangement. A higher switching factor $\kappa$ means a more efficient switch, as long as the current is lower than $I_c(0)$. Also, a higher critical current in the low resistance state enables the electrical switch 1210 to output a higher maximum current.

Figure 15A:
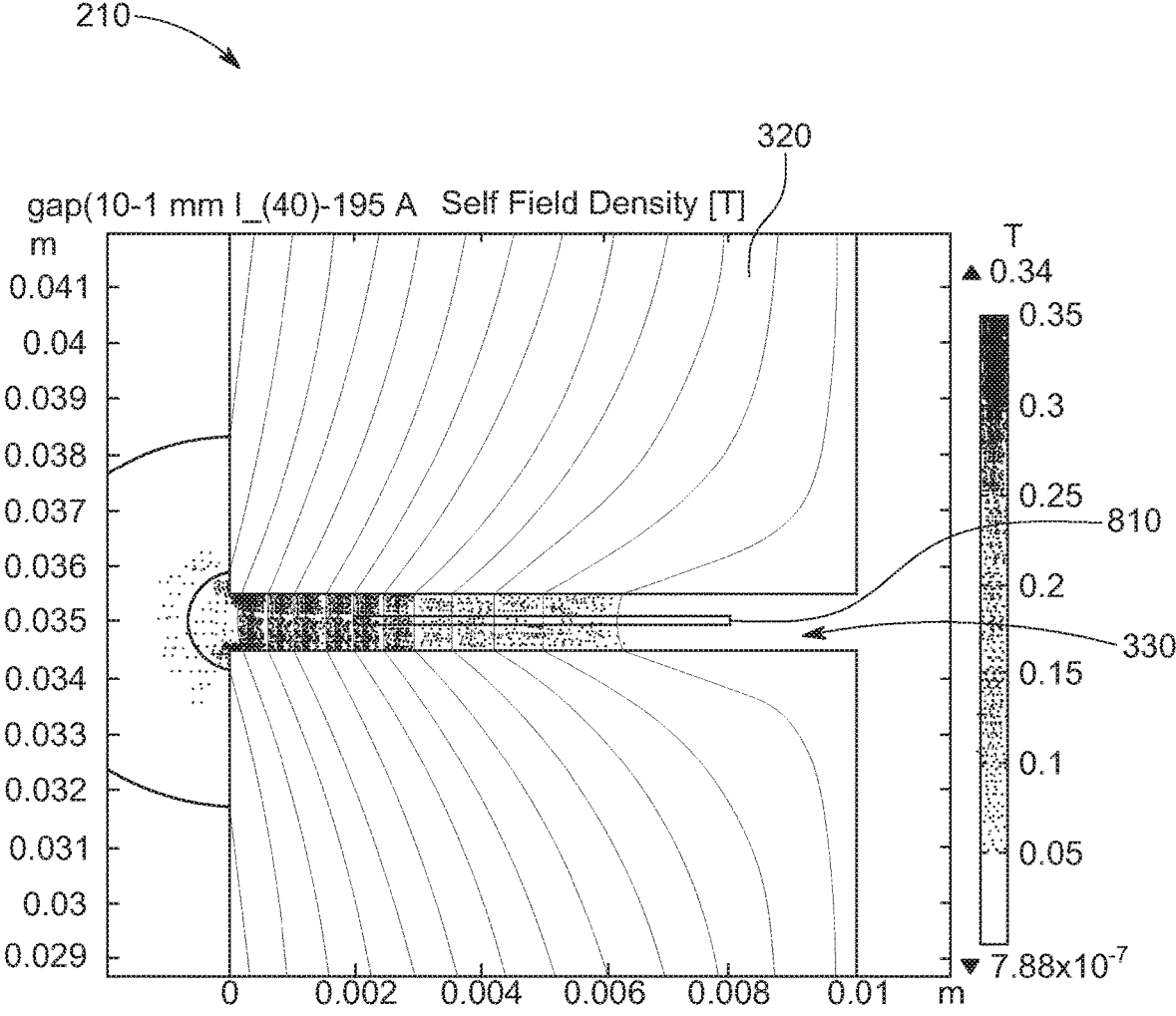
FIG. 15A shows a magnetic field profile for an electrical switch according to one form of the technology.
Figure 15B:
FIG. 15B shows a magnetic field profile for an electrical switch according to another form of the technology.
Figure 15B:
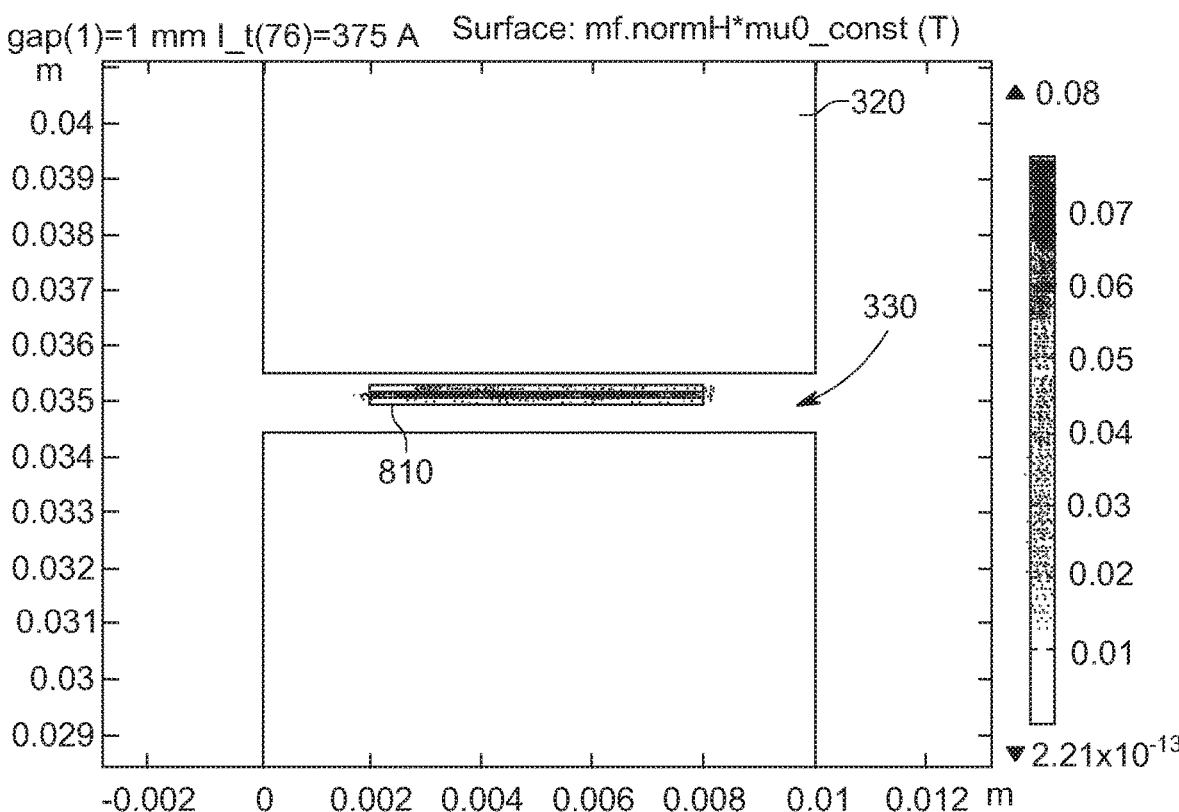

FIGS. 15A and 15B show magnetic field profiles within the gap between the ends of the ferromagnetic core 1320 for electrical switches 1210 according to certain forms of the technology. The electrical switch 1210 comprises a length 1810 of superconducting material in the form of a tape positioned between two ends of a ferromagnetic core 1320. The magnetic field profiles are generated by finite element analysis. In FIG. 15A the tape is arranged in the gap 1330 between the ends of the core 1320 in a unifilar arrangement, i.e. a single length of tape passes through the gap 1330. In FIG. 15A, the tape is modelled as carrying a current of 195 A and the magnetic field applied to the tape is modelled as having a magnetic field strength of 250 mT. In FIG. 15B the tape is arranged in the gap 1330 between the ends of the core 1320 in a bifilar arrangement, i.e. two strands of the tape are arranged in the gap 1330 parallel to each other and closely adjacent. In FIG. 15B, the tape is modelled as carrying a current of 375 A and the magnetic field applied to the tape is modelled as having a magnetic field strength of 70 mT.

FIGS. 15A and 15B show that the average magnetic field environment in the form of the technology in which the length of superconducting material is arranged in a unifilar arrangement (FIG. 15A) is significantly greater than that in the form of the technology in which the length of superconducting material is arranged in a bifilar arrangement (FIG. 15B). In fact, the bifilar arrangement almost eliminates the tape's self-inductance and the remaining magnetic field on the tape is largely in a direction parallel to the face of the tape. This explains why the critical current of the bifilar arrangement at zero applied field is significantly larger than for the unifilar tape (as shown in FIG. 14).

It has also been identified that, the larger the gap 1330 between the ends of the core 1320, the lower the magnetic field strength of the applied field. This means that, if the gap 1330 is increased, a larger current supply may be needed to be supplied to the magnetic field generator in order to maintain the same magnetic field strength. This may be undesirable as it requires additional driving power and dissipates additional heat. Consequently, in certain forms of the technology, the size of the gap 1330 may be as small as practically possible, for example the width of the gap 1330 is similar to the combined depth of the two strands of the length 1810 of superconducting material.

6.6. Other Remarks

Unless the context clearly requires otherwise, throughout the description and the claims, the words "comprise", "comprising", and the like, are to be construed in an inclusive sense as opposed to an exclusive or exhaustive sense, that is to say, in the sense of "including, but not limited to".

The entire disclosures of all applications, patents and publications cited above and below, if any, are herein incorporated by reference.

Reference to any prior art in this specification is not, and should not be taken as, an acknowledgement or any form of suggestion that that prior art forms part of the common general knowledge in the field of endeavour in any country in the world.

The technology may also be said broadly to consist in the parts, elements and features referred to or indicated in the specification of the application, individually or collectively, in any or all combinations of two or more of said parts, elements or features.

Where in the foregoing description reference has been made to integers or components having known equivalents thereof, those integers are herein incorporated as if individually set forth.

It should be noted that various changes and modifications to the presently preferred embodiments described herein will be apparent to those skilled in the art. Such changes and modifications may be made without departing from the spirit and scope of the technology and without diminishing its attendant advantages. It is therefore intended that such changes and modifications be included within the present technology.

The invention claimed is:

1. An electrical switch comprising:
   a length of superconducting material configured to carry a transport current, wherein the length of superconducting material has a critical current and a critical temperature;
   a magnetic field generator configured to apply a magnetic field to the length of superconducting material; and
   a heating assembly for heating the length of superconducting material,
   wherein the magnetic field generator and the heating assembly are configured to be selectively controlled independently or in combination to switch the length of superconducting material between a low-resistance state and a higher resistance state,
   wherein, in the low-resistance state, a magnitude of the magnetic field is relatively low and a temperature of the length of superconducting material is substantially less than the critical temperature such that the transport current is substantially less than the critical current,
   wherein, in a first configuration of the electrical switch in the higher-resistance state, the magnitude of the magnetic field is relatively high to reduce the critical current;
   wherein, in a second configuration of the electrical switch in the higher-resistance state, the heating assembly heats the length of superconducting material to reduce the critical current,
   wherein, in a third configuration of the electrical switch in the higher-resistance state, the magnitude of the magnetic field is relatively high and the heating assembly heats the length of superconducting material to reduce the critical current, and
   wherein, in each of the configurations of the electrical switch in the higher-resistance state, the critical current is reduced such that the transport current approaches the critical current, is substantially equal to the critical current or is greater than the critical current of the length of superconducting material.

2. An electrical switch as claimed in claim 1, wherein the magnetic field generator and the heating assembly are configured to be selectively activated and de-activated independently or in combination to switch the electrical switch between the low-resistance state and the higher resistance state.

3. An electrical switch as claimed in claim 2, wherein the heating assembly is configured to remain activated and the length of superconducting material is switched between the low-resistance state and the higher-resistance state by selective de-activation and activation of the magnetic field generator.

4. An electrical switch as claimed in claim 1, wherein the magnetic field applied by the magnetic field generator is a constant magnetic field.

5. An electrical switch as claimed in claim 1, wherein the heating assembly comprises a resistive heating element positioned in thermal contact with the length of superconducting material.

6. An electrical switch as claimed in claim 1, wherein the superconducting material is a high-temperature superconducting material.

7. An electrical switch as claimed in claim 1, wherein the magnetic field generator is a first magnetic field generator and the magnetic field is a first magnetic field, and wherein the electrical switch comprises a second magnetic field generator configured to apply a second, time-varying, magnetic field to the length of superconducting material, wherein the second magnetic field generator is configured to be selectively controlled to switch the length of superconducting material between the low-resistance state and the higher resistance state.

8. An electrical switch as claimed in claim 7, wherein the superconducting material is a tape having two opposed faces, and wherein the second magnetic field generator is configured to apply the second magnetic field in a direction substantially perpendicular to the two opposed faces.

9. An electrical switch as claimed in claim 7, wherein the first magnetic field generator and the second magnetic field generator are the same magnetic field generator, wherein the magnitude of the magnetic field applied by the same magnetic field generator varies in time with a DC bias.

10. An electrical switch as claimed in claim 1, wherein:
the length of superconducting material comprises a loop of superconducting material configured to carry the transport current between a first terminal and a second terminal, wherein the loop comprises a first branch and a second branch, the first and second branches being electrically connected in parallel between the first terminal and the second terminal, and wherein the loop has an axis which is substantially normal to the plane of the loop, and
the electrical switch further comprises:
a third, time-varying, magnetic field generator configured to apply a third, time-varying, magnetic field through the loop with the direction of the third magnetic field through the loop being generally parallel to, or having a component which is generally parallel to, the axis of the loop,
wherein, in the low-resistance state, the third magnetic field generator does not apply the third magnetic field through the loop and the transport current flows through the loop between the two terminals, and
wherein, in the higher-resistance state, the third magnetic field generator applies the third magnetic field through the loop, inducing a screening current in the loop such that a total current in one or more of the first branch and the second branch approaches the critical current, is substantially equal to the critical current or is greater than the critical current of the superconducting material.

11. An electrical switch as claimed in claim 1, wherein, in the higher-resistance state, the length of superconducting material is in a superconducting state.

12. An electrical switch comprising:
a length of superconducting material configured to carry a transport current, wherein the length of superconducting material has a critical current and a critical temperature;
a first magnetic field generator configured to apply a first, constant, magnetic field to the length of superconducting material; and
a second magnetic field generator configured to apply a second, time-varying, magnetic field to the length of superconducting material,
wherein the first magnetic field generator and the second magnetic field generator are configured to be selectively controlled independently or in combination to switch the length of superconducting material between a low-resistance state and a higher resistance state,
wherein, in the low-resistance state, magnitudes of the first magnetic field and the second magnetic field are relatively low and the transport current is substantially less than the critical current,
wherein, in a first configuration of the electrical switch in the higher-resistance state, the magnitude of the first magnetic field is relatively high to reduce the critical current such that the transport current approaches the critical current, is substantially equal to the critical current or is greater than the critical current of the length of superconducting material,
wherein, in a second configuration of the electrical switch in the higher-resistance state, the second magnetic field creates dynamic resistance in the length of superconducting material, and
wherein, in a third configuration of the electrical switch in the higher-resistance state, the magnitude of the first magnetic field is relatively high to reduce the critical current such that the transport current approaches the critical current, is substantially equal to the critical current or is greater than the critical current of the length of superconducting material, and the second magnetic field creates dynamic resistance in the length of superconducting material.

13. An electrical switch as claimed in claim 12, wherein the first magnetic field generator and the second magnetic field generator are configured to be selectively activated and de-activated independently or in combination to switch the length of superconducting material between the low-resistance state and the higher resistance state.

14. An electrical switch as claimed in claim 13, wherein the first magnetic field generator is configured to remain activated and the length of superconducting material is switched between the low-resistance state and the higher-resistance state by selective de-activation and activation of the second magnetic field generator.

15. An electrical switch as claimed in claim 13, wherein the second magnetic field generator is configured to remain activated and the length of superconducting material is switched between the low-resistance state and the higher-resistance state by selective de-activation and activation of the first magnetic field generator.

16. An electrical switch as claimed in claim 12, wherein the superconducting material is a tape having two opposed faces, and wherein the second magnetic field generator is configured to apply the second magnetic field in a direction substantially perpendicular to the two opposed faces.

17. An electrical switch as claimed in claim 12, wherein the first magnetic field generator and the second magnetic field generator are the same magnetic field generator, wherein the magnitude of the magnetic field applied by the same magnetic field generator varies in time with a DC bias.

18. An electrical switch as claimed in claim 12, wherein the superconducting material is a high-temperature superconducting material.

19. An electrical switch as claimed in claim 12, wherein the electrical switch further comprises a heating assembly for heating the length of superconducting material, wherein, in the higher-resistance state, the heating assembly heats the length of superconducting material to reduce the critical current such that the transport current approaches the critical current, is substantially equal to the critical current or is greater than the critical current of the length of superconducting material.

20. An electrical switch as claimed in claim 19, wherein the heating assembly comprises a resistive heating element positioned in thermal contact with the length of superconducting material.

21. An electrical switch as claimed in claim 12, wherein:

the length of superconducting material comprises a loop of superconducting material configured to carry the transport current between a first terminal and a second terminal, wherein the loop comprises a first branch and a second branch, the first and second branches being electrically connected in parallel between the first terminal and the second terminal, and wherein the loop has an axis which is substantially normal to the plane of the loop, and the electrical switch further comprises:

a third, time-varying, magnetic field generator configured to apply a third, time-varying, magnetic field through the loop with the direction of the third magnetic field through the loop being generally parallel to, or having a component which is generally parallel to, the axis of the loop, wherein, in the low-resistance state, the third magnetic field generator does not apply the third magnetic field through the loop and the transport current flows through the loop between the two terminals, and wherein, in the higher-resistance state, the third magnetic field generator applies the third magnetic field through the loop, inducing a screening current in the loop such that a total current in one or more of the first branch and the second branch approaches the critical current, is substantially equal to the critical current or is greater than the critical current of the superconducting material.

22. An electrical switch as claimed in claim 12, wherein, in the higher-resistance state, the length of superconducting material is in a superconducting state.

*    *    *    *    *